(12) United States Patent
Park et al.

(10) Patent No.: US 11,476,832 B2
(45) Date of Patent: Oct. 18, 2022

(54) BULK-ACOUSTIC RESONATOR MODULE

(71) Applicant: Samsung Electro-Mechanics Co., Ltd., Suwon-si (KR)

(72) Inventors: Seung Wook Park, Suwon-si (KR); Tae Kyung Lee, Suwon-si (KR); Seong Hun Na, Suwon-si (KR); Jae Chang Lee, Suwon-si (KR); Jae Hyun Jung, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 633 days.

(21) Appl. No.: 16/540,480

(22) Filed: Aug. 14, 2019

(65) Prior Publication Data
US 2020/0177155 A1 Jun. 4, 2020

(30) Foreign Application Priority Data

Nov. 30, 2018 (KR) .................. 10-2018-0152385
Apr. 10, 2019 (KR) .................. 10-2019-0042081

(51) Int. Cl.
*H03H 9/10* (2006.01)
*H03H 9/05* (2006.01)
*H01L 41/09* (2006.01)
*H01L 41/053* (2006.01)
*H03H 3/02* (2006.01)
*H03H 9/60* (2006.01)
*H01L 41/047* (2006.01)
(Continued)

(52) U.S. Cl.
CPC ....... *H03H 9/1007* (2013.01); *H01L 41/0475* (2013.01); *H01L 41/0533* (2013.01); *H01L 41/0973* (2013.01); *H03H 3/02* (2013.01); *H03H 9/0514* (2013.01); *H03H 9/0542* (2013.01); *H03H 9/174* (2013.01); *H03H 9/588* (2013.01); *H03H 9/605* (2013.01); *H01L 41/332* (2013.01); *H03H 9/02086* (2013.01); *H03H 2003/023* (2013.01)

(58) Field of Classification Search
CPC .................................................. H03H 9/1007
USPC ........................................................ 310/344
See application file for complete search history.

(56) References Cited

U.S. PATENT DOCUMENTS 9,646,857 B2   5/2017   Glascock et al.
9,793,877 B2  10/2017   Martin et al.
(Continued)

FOREIGN PATENT DOCUMENTS

CN        104104357 A      10/2014
KR       10-0576167 B1      5/2006
KR    10-2017-0130228 A    11/2017

OTHER PUBLICATIONS

Korean Office Action dated Jun. 19, 2020 in the corresponding Korean Patent Application No. 10-2019-0042081 (6 pages in English and 5 pages in Korean).

*Primary Examiner* — Joseph Chang
(74) *Attorney, Agent, or Firm* — NSIP Law

(57) ABSTRACT

A bulk-acoustic resonator module includes: a module substrate; a bulk-acoustic resonator connected to the module substrate by a connection terminal and disposed spaced apart from the module substrate; and a sealing portion sealing the bulk-acoustic resonator. The bulk-acoustic resonator includes a resonating portion disposed opposite to an upper surface of the module substrate. A space is disposed between the resonating portion and the upper surface of the module substrate.

20 Claims, 22 Drawing Sheets

(51) Int. Cl.
  *H03H 9/17* (2006.01)
  *H03H 9/58* (2006.01)
  *H03H 9/02* (2006.01)
  *H01L 41/332* (2013.01)

(56) References Cited

U.S. PATENT DOCUMENTS

| | | |
|---|---|---|
| 2004/0159960 A1 | 8/2004 | Fujiwara et al. |
| 2004/0251777 A1 | 12/2004 | Yamamoto et al. |
| 2007/0182029 A1* | 8/2007 | Franosch .............. H01L 21/561 257/793 |
| 2007/0200146 A1 | 8/2007 | Onishi et al. |
| 2017/0338399 A1 | 11/2017 | Kim et al. |

* cited by examiner

"A"

BULK-ACOUSTIC RESONATOR MODULE

CROSS-REFERENCE TO RELATED APPLICATIONS

This application claims the benefit under 35 U.S.C. § 119(a) of Korean Patent Application Nos. 10-2018-0152385 and 10-2019-0042081 filed on Nov. 30, 2018 and Apr. 10, 2019, respectively, in the Korean Intellectual Property Office, the entire disclosures of which are incorporated herein by reference for all purposes.

BACKGROUND

1. Field

The following description relates to a bulk-acoustic resonator module.

2. Description of Related Art

With the recent rapid development of mobile communication devices, chemical and biological devices, and the like, demand for a small, lightweight filter, an oscillator, a resonant element, an acoustic resonant mass sensor, and the like, which are used in such devices, is increasing.

Such an acoustic resonator may be configured as a device for implementing such a small, lightweight filter, an oscillator, a resonant element, an acoustic resonant mass sensor, and the like, and may be implemented as a thin bulk acoustic resonator (FBAR).

An FBAR may be mass-produced at a minimal cost, and may be configured to have subminiature size. In addition, the FBAR may implement a high quality factor (QF) value, which is a main characteristic of a filter, and may be used even in the microwave frequency band. For example, the FBAR may be used in bands of a personal communication system (PCS) and a digital cordless system (DCS).

Generally, the FBAR has a structure including a resonating portion formed by sequentially stacking a first electrode, a piezoelectric body, and a second electrode on a substrate.

A principle of operation of the FBAR is as follows. First, when electrical energy is applied to the first and second electrodes to induce an electric field in the piezoelectric layer, the electric field causes a piezoelectric phenomenon in the piezoelectric layer, such that the resonating portion vibrates by a predetermined distance. As a result, a bulk acoustic wave is generated in the same direction in which vibrations and resonance occur.

That is, the FBAR is an element using a bulk acoustic wave (BAW), and an effective electromechanical coupling coefficient ($kt^2$) of the piezoelectric body is increased, such that the frequency characteristics of the acoustic wave element are improved and it is also possible to achieve a wide bandwidth.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic resonator module includes: a module substrate; a bulk-acoustic resonator connected to the module substrate by a connection terminal and disposed spaced apart from the module substrate; and a sealing portion sealing the bulk-acoustic resonator. The bulk-acoustic resonator includes a resonating portion disposed opposite to an upper surface of the module substrate. A space is disposed between the resonating portion and the upper surface of the module substrate.

The bulk-acoustic resonator may further include: a resonator substrate; an insulating layer disposed on a surface of the resonator substrate; a membrane layer forming a cavity together with the insulating layer, the resonating portion being disposed on the cavity, and comprising a first electrode, a piezoelectric layer, and a second electrode arranged in a stacked configuration; a protective layer disposed on the first electrode, the piezoelectric layer, and the second electrode in the resonating portion; and a hydrophobic layer disposed on the protective layer.

The hydrophobic layer may have a contact angle of 90° or more with water.

The hydrophobic layer may include either one or both of fluorine (F) and silicon (Si).

The hydrophobic layer may surround the cavity and the membrane layer.

The protective layer may include a first protective layer formed of a silicon oxide-based or a silicon nitride-based insulating material, and a second protective layer formed of any one of an aluminum oxide-based insulating material, an aluminum nitride-based insulating material, a magnesium oxide-based insulating material, a titanium oxide-based insulating materials, a zirconium oxide-based insulating material, and a zinc oxide-based insulating material.

A distance between the bulk-acoustic resonator and the module substrate may be 10 μm to 30 μm.

A trench may be formed in the upper surface of the module substrate. A portion of the connection terminal connecting the bulk-acoustic resonator to the module substrate may be disposed in the trench.

The bulk-acoustic resonator module of claim 8, wherein a distance between the upper surface of the module substrate and a rim of a lower surface of the bulk-acoustic resonator is 0 μm to 20 μm.

A horizontal length of the trench may be shorter than a horizontal length of the bulk-acoustic resonator.

A depth of the trench may be 20 μm to 30 μm.

The bulk-acoustic resonator module may further include a blocking member disposed between the bulk-acoustic resonator and the module substrate.

The blocking member may be in contact with at least one surface of the connection terminal.

The blocking member may be spaced apart from the upper surface of the module substrate.

A trench may be formed in the upper surface of the module substrate, and the blocking member may be disposed in the trench.

The blocking member may be made of a conductive material, and may be spaced apart from the connection terminal.

The bulk-acoustic resonator module may further include a blocking member disposed outside of the connection terminal and formed to cover a side surface of the connection terminal.

The bulk-acoustic resonator module may further include an electronic device mounted on the module substrate so as to be disposed adjacent to the bulk-acoustic resonator.

The bulk-acoustic resonator may further include a resonator substrate. The resonating portion may include a first electrode, a piezoelectric layer, and a second electrode stacked on a cavity formed on the resonator substrate. The bulk-acoustic resonator module may further include a blocking member disposed between the bulk-acoustic resonator and the module substrate, outside of the connection terminal, and at least partially covering a side surface of the resonator substrate.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
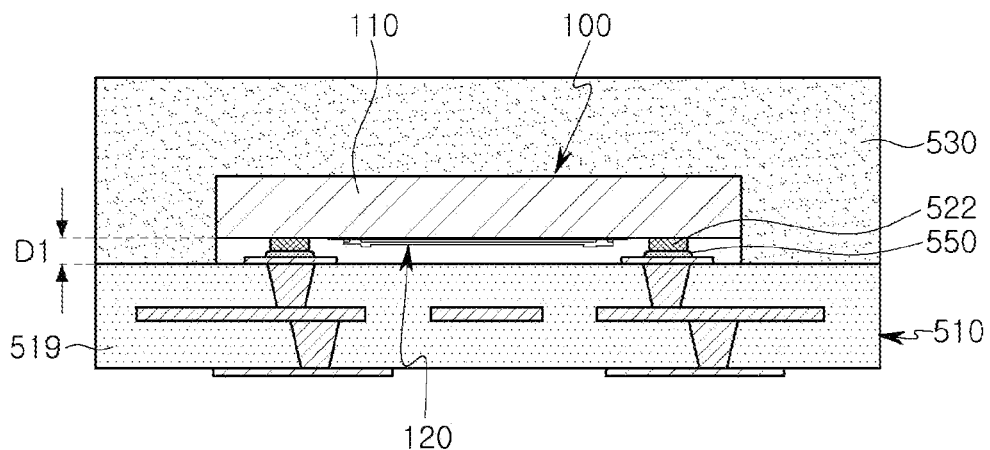
FIG. 1 is a schematic cross-sectional view illustrating a bulk-acoustic resonator module in which an acoustic resonator is mounted, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above"

or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a schematic cross-sectional view illustrating a bulk-acoustic resonator module 500 in which a bulk-acoustic resonator 100 is mounted, according to an embodiment.

Referring to FIG. 1, the bulk-acoustic resonator module 500 may include at least one bulk-acoustic resonator 100, a module substrate 510, and a sealing portion 530.

The bulk-acoustic resonator 100 may be disposed on the module substrate 510. Even though only one resonating portion 120 is shown disposed on a resonator substrate 110 in FIG. 1, it is also possible to dispose a plurality of resonating portions 120 on the resonator substrate 110, if necessary.

Figure 3:
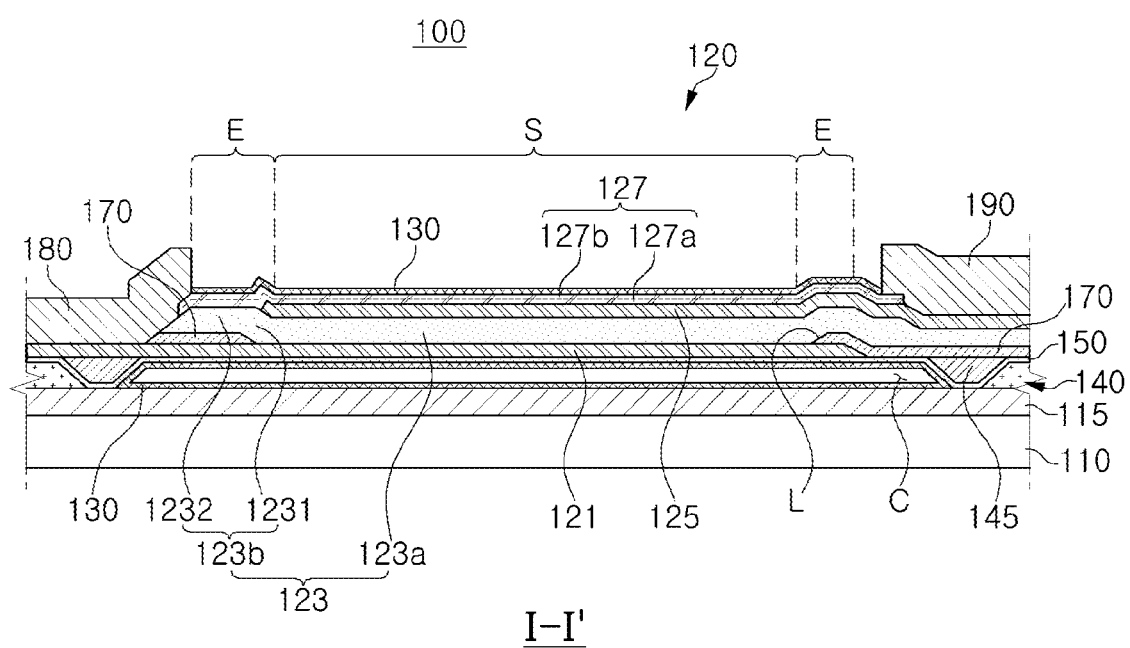
FIG. 3 is a cross-sectional view taken along line I-I' of FIG. 2.

The bulk-acoustic resonator 100 may have connection terminals 522 mounted on the module substrate 510. The connection terminals 522 may electrically connect the resonating portion 120 to the module substrate 510. Therefore, at least one connection terminal 522 may be connected to a first electrode 121 (see. FIG. 3) and at least one connection terminal 522 may be connected to a second electrode 123 (see. FIG. 3).

The connection terminal 522 may penetrate a protective layer 127 (see. FIG. 3) similarly to a first metal layer 180 (see. FIG. 3) and a second metal layer 190 (see. FIG. 3). For example, the connection terminal 522 may be configured to extend from the first metal layer 180 and the second metal layer 190, but is not limited to such a configuration. The connection terminal 522 may be disposed separately from the first metal layer 180 and the second metal layer 190.

Figure 22:
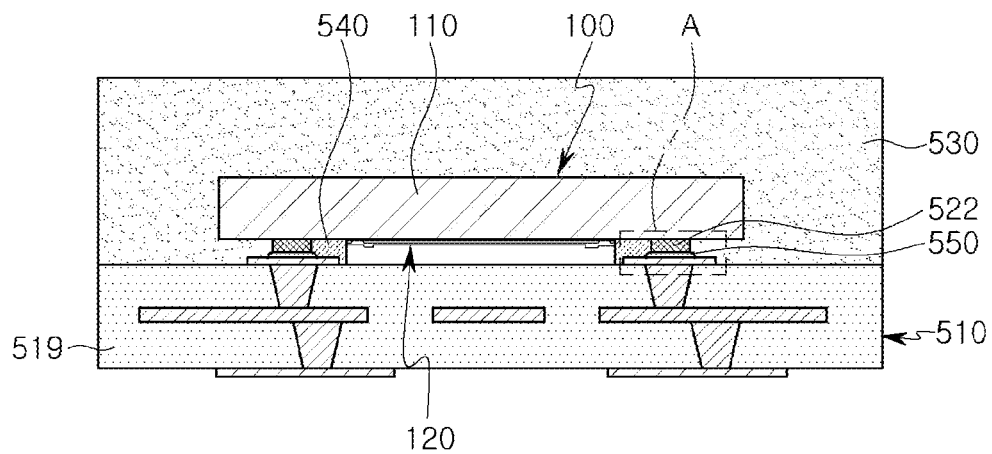
FIG. 22 is a schematic cross-sectional view illustrating a bulk-acoustic resonator module, according to an embodiment.

The connection terminal 522 may be manufactured by a plating method, as illustrated in FIG. 22, and may be formed by stacking a tin-silver compound (SnAg) 522a (see FIG. 23) on the first electrode 121 or the second electrode 123, or on the first metal layer 180 or the second metal layer 190, and may be further formed by stacking copper (Cu) 522b on the tin-silver compound (SnAg) 522a (see FIG. 23), but is not limited to such a configuration.

In addition, the connection terminal 522 may be bonded to one surface of the module substrate 510 through a conductive adhesive 550 such as a solder.

The bulk-acoustic resonator 100 may be mounted on the module substrate 510 in such a manner that the resonating portion 120 faces one surface (for example, a mounting surface) of the module substrate 510. Therefore, a space between the resonating portion 120 and the module substrate 510 may be filled with gas or formed in a vacuum state.

A detailed description of the bulk-acoustic resonator 100 will be provided later.

Various types of circuit substrates (for example, a ceramic substrate, a printed circuit board, a glass substrate, a flexible substrate, and the like) that are well known in the art may be used.

In the embodiment of FIG. 1, a printed circuit board in which a polymer (for example, an epoxy resin, a bismaleimide-triazine (BT) resin, or the like) is used as an insulator 519 may be used as the module substrate 510. However, the disclosure is not limited to the foregoing examples.

The sealing portion 530 may seal the bulk-acoustic resonator 100 mounted on the module substrate 510 to protect the bulk-acoustic resonator 100 from external environments.

The sealing portion 530 may be formed by an injection molding method. For example, an epoxy mold compound (EMC) may be used as a material of the sealing portion 530. However, the disclosure is not limited to this example, and the sealing portion 530 may be formed of various materials other than the epoxy mold compound (EMC). In addition, the sealing portion 530 may be manufactured by using various methods in which a semi-cured resin is pressed to form the sealing portion 530, or the like.

The bulk-acoustic resonator module 500 may be manufactured by mounting the bulk-acoustic resonator 100 on the module substrate 510 and then forming the sealing portion 530. However, when a molding resin as a raw material of the sealing portion 530 flows between the bulk-acoustic resonator 100 and the module substrate 510 in the process of forming the sealing portion 530, the resonating portion 120 may be broken by the molding resin.

It has been confirmed that, if a distance D1 between a lower surface of the bulk-acoustic resonator 100 and an upper surface of the module substrate 510 is 30 μm or less, a gap between the bulk-acoustic resonator 100 and the module substrate 510 is very narrow and the molding resin does not easily flow into the gap. In addition, if the distance D1 is less than 10 μm, the resonating portion 120 may be disposed very close to the module substrate 510 such that the resonating portion 120 may be in contact with the module substrate 510 during the manufacturing process.

Therefore, according to an example, the bulk-acoustic resonator module 500 may have a distance D1 between the bulk-acoustic resonator 100 and the module substrate 510 of 10 μm to 30 μm.

In addition, the bulk-acoustic resonator module 500 o may be disposed such that the resonating portion 120 directly faces the module substrate 510. In the related art, the resonating portion 120 is disposed in a space formed by a member such as a cover, a cap, or the like, and the resonating portion 120 is thereby blocked from external spaces to prevent a hydroxyl group (OH group) from being adsorbed on the resonating portion 120. Accordingly, in the related art, the resonating portion 120 is configured to face a member such as a cover, a cap, or the like.

In addition, a printed circuit board (PCB), in which a polymer is used as an insulator 529, is generally used as a module substrate. However, since the polymer generally has hygroscopic properties, when the bulk-acoustic resonator 100 in the related art is mounted on such a printed circuit board, the hydroxyl group may be easily adsorbed to the resonating portion 120. Therefore, in the related art, as described above, a member such as a cover, a cap, or the like is coupled to the bulk-acoustic resonator 100 to seal the space in which the resonant portion 120 is disposed in an airtight manner, and is mounted on the module substrate 510.

However, the bulk-acoustic resonator 100 may suppress the adsorption of the hydroxyl group (OH group) to the resonating portion 120 through the protective layer 127 (see. FIG. 3) and the hydrophobic layer 130 (see. FIG. 3). Therefore, since it is not necessary to form an airtight seal of the space in which the resonating portion 120 is disposed, the bulk-acoustic resonator 100, in which a member such as a cover, a cap, or the like is omitted, may be mounted directly on the module substrate 510.

In addition, since the resonating portion 120 is not affected by a material of the insulator 519 of the module substrate 510, the module substrate 510 may be manufactured with various materials.

Therefore, manufacturing of the bulk-acoustic resonator 100 is very easy and manufacturing costs may be reduced.

Hereinafter, the bulk-acoustic resonator 100 will be described in more detail.

Figure 2:
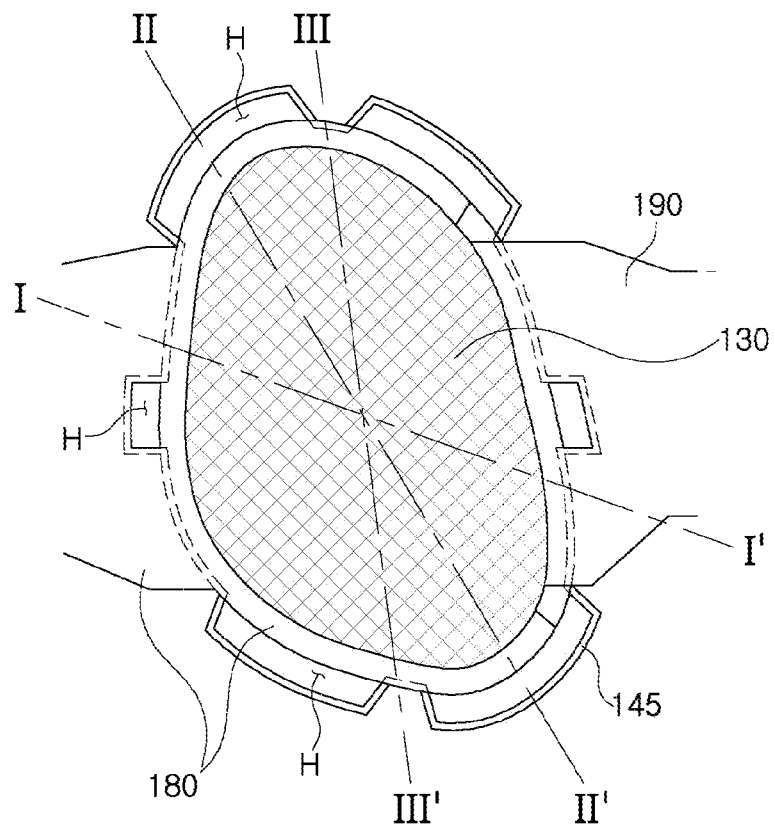
FIG. 2 is a plan view illustrating an acoustic resonator, according to an embodiment.
Figure 4:
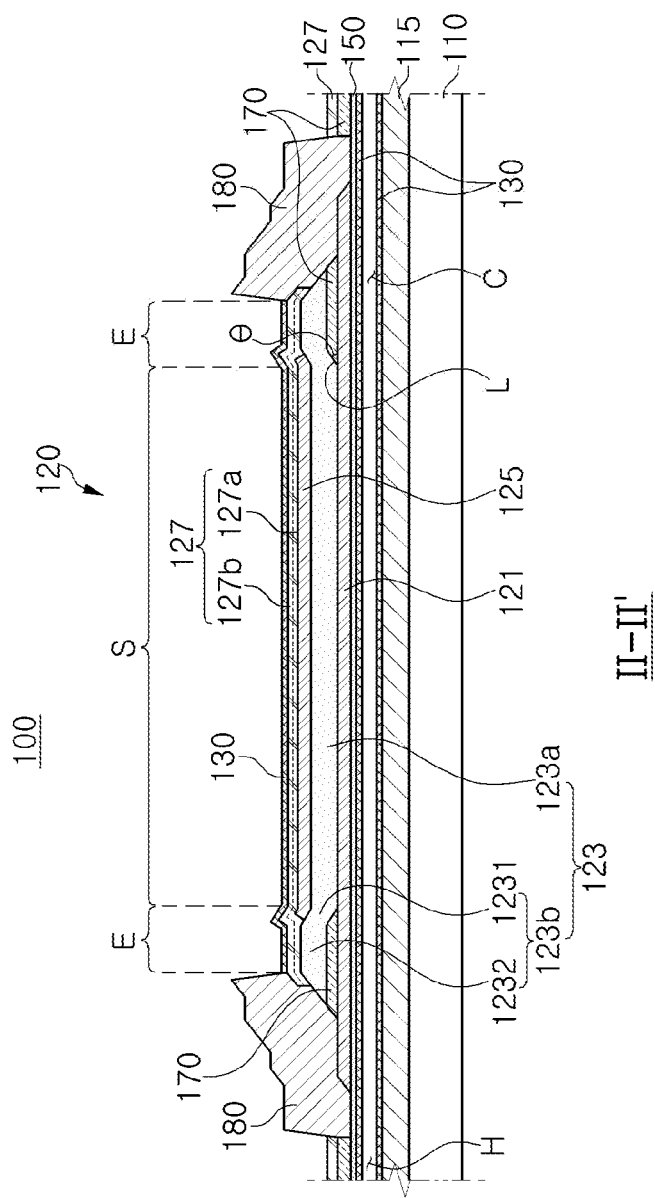
FIG. 4 is a cross-sectional view taken along line II-II' of FIG. 2.
Figure 5:
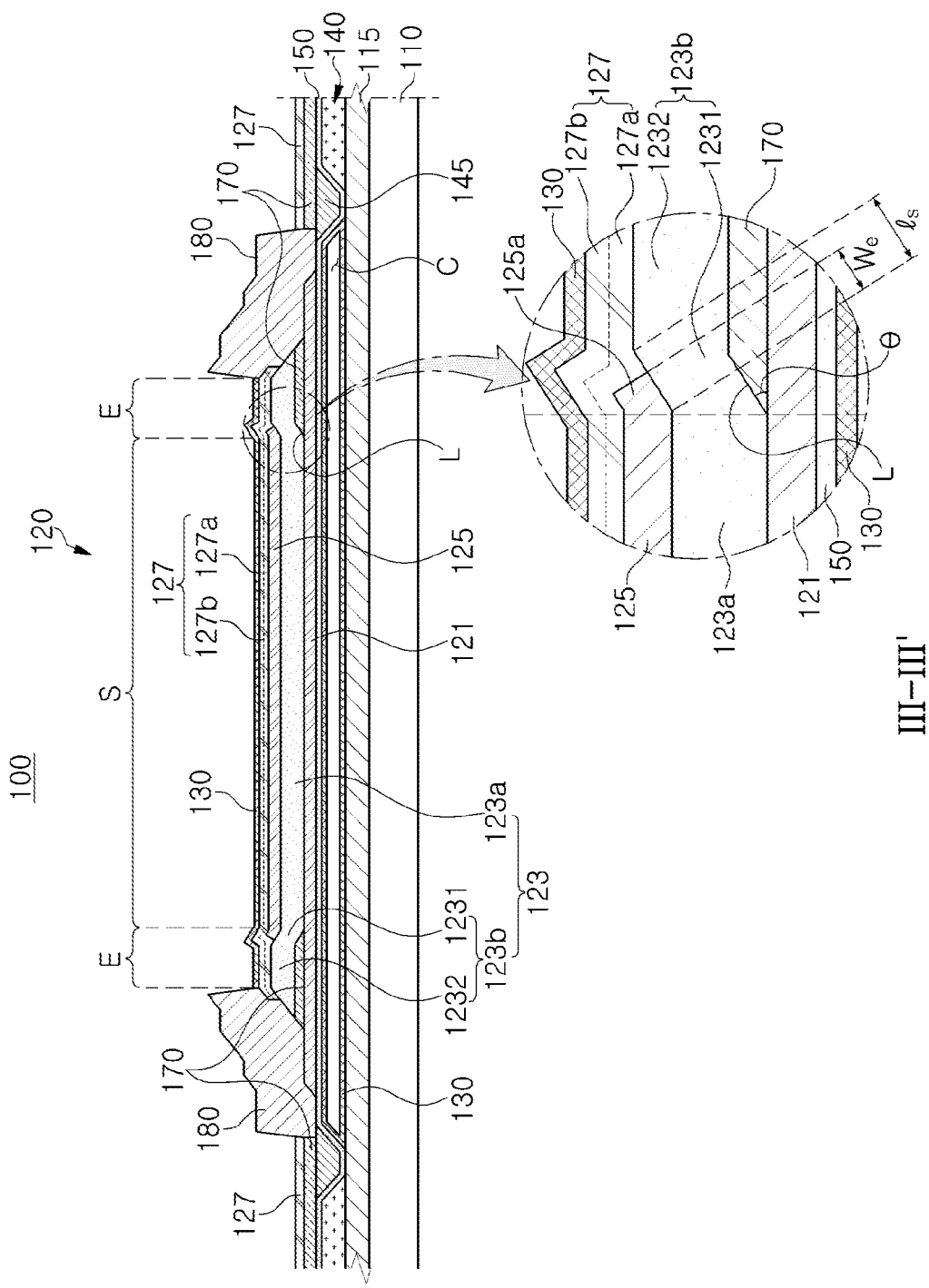
FIG. 5 is a cross-sectional view taken along line of FIG. 2.

FIG. 2 is a plan view of the bulk-acoustic resonator 100. FIG. 3 is a cross-sectional view taken along line I-I' of FIG. 2. FIG. 4 is a cross-sectional view taken along line II-II' of FIG. 2. FIG. 5 is a cross-sectional view taken along line III-III' of FIG. 2.

Referring to FIGS. 2 to 5, the bulk-acoustic resonator 100 may be a film bulk acoustic resonator (FBAR), and may include the resonator substrate 110, an insulating layer 115, a membrane layer 150, a cavity C, the resonating portion 120, the protective layer 127, and the hydrophobic layer 130.

The resonator substrate 110 may be a silicon substrate. For example, a silicon wafer may be used as the resonator substrate 110. Alternatively, a silicon on insulator (SOI) type substrate may be used.

The insulating layer 115 may be formed on an upper surface of the resonator substrate 110, and the resonator substrate 110 may be electrically isolated from a structure/components disposed thereabove. In addition, the insulating layer 115 may prevent the resonator substrate 110 from being etched by an etching gas when a cavity C is formed during a manufacturing process.

In this case, the insulating layer 115 may be formed of any one or any combination of any two or more of silicon dioxide ($SiO_2$), silicon nitride ($Si_3N_4$), aluminum oxide ($Al_2O_3$) and aluminum nitride (AlN), and may be formed through a process of chemical vapor deposition, RF magnetron sputtering or evaporation.

The sacrificial layer 140 may be formed on the insulating layer 115, and the cavity C and the etch stop portion 145 may be disposed inside the sacrificial layer 140.

The cavity C is formed as an empty space, and may be formed by removing a portion of the sacrificial layer 140. Since the cavity C is formed in the sacrificial layer 140, the resonating portion 120, which is formed on an upper portion of the sacrificial layer 140, may be formed to be flat as a whole.

The etch stop portion 145 may be disposed along a boundary of the cavity C. The etch stop portion 145 may prevent etching from progressing beyond a cavity region in a process of forming the cavity C. Thus, the horizontal area of the cavity C is defined/bounded by the etch stop portion 145, and the vertical area is defined by the thickness of the sacrificial layer 140.

The membrane layer 150 may be formed on the sacrificial layer 140 to define the thickness (or height) of the cavity C together with the resonator substrate 110. Accordingly, the membrane layer 150 may be formed of a material which may not be easily removed in the process of forming the cavity C.

For example, when a halide-based etching gas such as fluorine (F), chlorine (Cl), or the like is used to remove a portion of the sacrificial layer 140 (for example, a cavity region), the membrane layer 150 may be formed of a material having low reactivity with the etching gas. In this case, the membrane layer 150 may include either one or both of silicon dioxide ($SiO_2$) and silicon nitride ($Si_3N_4$).

In addition, the membrane layer 150 may be formed by a dielectric layer containing any one or any combination of any two or more of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) and may be formed of a metal layer containing at least one of aluminum (Al), nickel (Ni), chrome (Cr), platinum (Pt), gallium (Ga), and hafnium (Hf). However, the present disclosure is not limited to these examples.

A seed layer (not shown) made of aluminum nitride (AlN) may be formed on the membrane layer 150. Specifically, the seed layer may be disposed between the membrane layer 150 and the first electrode 121. In addition to AlN, the seed layer may be formed using a dielectric material of metal having an HCP structure. In the case of metal, for example, the seed layer may be formed of titanium (Ti).

The resonating portion 120 may include a first electrode 121, a piezoelectric layer 123, and a second electrode 125. In the resonating portion 120, the first electrode 121, the piezoelectric layer 123, and the second electrode 125 may be stacked sequentially from a bottom of the resonating portion 120. Therefore, the piezoelectric layer 123 may be disposed between the first electrode 121 and the second electrode 125 in the resonating portion 120.

The resonating portion 120 is formed on the membrane layer 150, such that the membrane layer 150, the first electrode 121, the piezoelectric layer 123, and the second electrode 125 are sequentially stacked on the resonator substrate 110 to form the resonating portion 120.

The resonating portion 120 may resonate the piezoelectric layer 123 according to a signal applied to the first electrode 121 and the second electrode 125 to generate a resonance frequency and an anti-resonance frequency.

When an insertion layer 170 to be described later is formed, the resonating portion 120 may be divided into a central portion S in which the first electrode 121, the piezoelectric layer 123, and the second electrode 125 are stacked substantially flat and an extension portion E in which the insertion layer 170 is interposed between the first electrode 121 and the piezoelectric layer 123.

The central portion C may be a region disposed at a center of the resonating portion 120 and the extension portion E may be a region disposed along a periphery of the central portion S. Therefore, the extension portion E may be a region extending outward from the central portion S.

The insertion layer 170 may have an inclined surface L at which the thickness increases as the distance from the central portion S increases.

Portions of the piezoelectric layer 123 and the second electrode 125 in the extension portion E may be disposed on the insertion layer 170. Therefore, the portions of the piezoelectric layer 123 and the second electrode 125 located at the extension portion E may have an inclined surface along the shape of the insertion layer 170.

In the embodiment of FIGS. 2-5, the extension portion E is included in the resonating portion 120, such that resonance may also occur in the extension portion E. However, the disclosure is not limited to this example. Depending on the structure of the extension portion E, resonance may not occur in the extension portion E, and resonance may occur only in the central portion S.

The first electrode 121 and the second electrode 125 may be formed of a conductive material such as gold, molybdenum, ruthenium, iridium, aluminum, platinum, titanium, tungsten, palladium, tantalum, chromium, nickel, or an alloy containing any one or any combination of any two or more of gold, molybdenum, ruthenium, iridium, aluminum, platinum, titanium, tungsten, palladium, tantalum, chromium, and nickel, but is not limited to these materials.

The first electrode 121 may be formed to have an area that is larger than an area of the second electrode 125, and a first metal layer 180 may be disposed on the first electrode 121 along an outer periphery of the first electrode 121. Accordingly, the first metal layer 180 may be disposed to surround the second electrode 125.

The first electrode 121 may be disposed on the membrane layer 150, such that the first electrode 121 may be formed to be substantially flat. The second electrode 125 may be disposed on the piezoelectric layer 123, such that the second electrode 125 includes portions that are bent to correspond to the shape of the piezoelectric layer 123.

The second electrode 125 may be disposed throughout the entirety of the central portion C and may be partially disposed in the extension portion E. Thus, the second electrode 125 may include a portion disposed on a piezoelectric portion 123*a* of the piezoelectric layer 123, to be described later, and a portion disposed on a bent portion 123*b* of the piezoelectric layer 123.

More specifically, the second electrode 125 may be disposed to cover an entirety of the piezoelectric portion 123*a* and a portion of an inclined portion 1231 of the piezoelectric layer 123. Therefore, a portion of the second electrode 125*a* disposed in the extension portion E may be formed to have an area that is less than an area of an inclined surface of the inclined portion 1231, and the second electrode 125 may be formed to have an area that is smaller than the piezoelectric layer 123 in the resonating portion 120.

The piezoelectric layer 123 may be formed on the first electrode 121. When the insertion layer, to be described later, is formed, the piezoelectric layer 123 may be formed on the first electrode 121 and the insertion layer 170.

For example, zinc oxide (ZnO), aluminum nitride (AlN), doped aluminum nitride, lead zirconate titanate, quartz, or the like, may be selectively used as a material of the piezoelectric layer 123. The doped aluminum nitride may further include a rare earth metal, a transition metal, or an alkaline earth metal. As an example, the rare earth metal may include any one or any combination of any two or more of scandium (Sc), erbium (Er), yttrium (Y), and lanthanum (La). The transition metal may include any one or any combination of any two or more of hafnium (Hf), titanium (Ti), zirconium (Zr), tantalum (Ta), and niobium (Nb). In addition, the alkaline earth metal may include magnesium (Mg).

The piezoelectric layer 123 may include the piezoelectric portion 123*a* disposed in the central portion S and the bent portion 123*b* disposed in the extension portion E.

The piezoelectric portion 123*a* may be a portion directly stacked on an upper surface of the first electrode 121. Accordingly, the piezoelectric portion 123*a* may be interposed between the first electrode 121 and the second electrode 125 to be formed in a flat shape together with the first electrode 121 and the second electrode 125.

The bent portion 123*b* may be a region extending outwardly of the piezoelectric portion 123*a* to be located in the extension portion E.

The bent portion 123*b* may be disposed on the insertion layer 170, to be described later, and may be formed in a raised shape along the shape of the insertion layer 170. Thus, the piezoelectric layer 123 may be bent at a boundary of the piezoelectric portion 123*a* and the bent portion 123*b*, and the bent portion 123*b* may be raised corresponding to the thickness and shape of the insertion layer 170.

As stated above, the bent portion 123*b* may include the inclined portion 1231 and the extension portion 1232. The inclined portion 1231 may be inclined along an inclined surface L of the insertion layer 170. The extension portion 1232 may be a portion extending outwardly of the inclined portion 1231.

The inclined portion 1231 may be formed to be parallel to the inclined surface L of the insertion layer 170, and an inclination angle of the inclined portion 1231 may be formed to be equal to the inclination angle ($\theta$ of FIG. 4) of the inclined surface L of the insertion layer 170.

The insertion layer 170 may be disposed along a surface formed by the membrane layer 150, the first electrode 121, and the etch stop portion 145.

The insertion layer 170 may be disposed at a periphery of the central portion S to support the bent portion 123*b* of the piezoelectric layer 123. Therefore, the bent portion 123*b* of the piezoelectric layer 123 may be divided into the inclined portion 1231 and the extension portion 1232 along the shape of the insertion layer 170.

The insertion layer 170 may be disposed in a region excluding the central portion S. For example, the insertion layer 170 may be disposed over an entire region excluding the central portion S, or may be disposed in parts of a region excluding the central portion S.

In addition, at least a portion of the insertion layer 170 may be disposed between the piezoelectric layer 123 and the first electrode 121.

A side surface of the insertion layer 170 disposed along the boundary of the central portion S may be formed in a thicker form as the distance from the central portion S increases. Thus, the insertion layer 170 may be formed of the inclined surface L having an inclination angle ($\theta$) in which a side surface thereof, disposed adjacent to the central portion S, is constant.

In order to manufacture the insertion layer 170 such that the inclination angle ($\theta$) of the side surface of the insertion layer 170 is less than 5°, the thickness of the insertion layer 170 may be formed to be very thin or an area of the inclined surface L may be extremely large. Such configurations may be substantially difficult to implement.

In addition, when the inclination angle ($\theta$) of the side surface of the insertion layer 170 is formed to be larger than 70°, the inclination angle of the inclination portion 1231 of the piezoelectric layer 123 stacked on the insertion layer 170 may be also formed to be larger than 70°. In this case, since the piezoelectric layer 123 is excessively bent, cracking may occur in the bent portion of the piezoelectric layer 123.

Therefore, in the embodiment of FIGS. 2-5, the inclination angle ($\theta$) of the inclination surface L may be equal to or greater than 5° and less than or equal to 70°.

The insertion layer 170 may be formed of a dielectric material such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), zinc oxide (ZnO), or the like, but may be formed of a material different from the material of the piezoelectric layer 123. In addition, if necessary, it is also possible to form a region in which the insertion layer 170 is provided as an air space. This may be realized by forming all of the resonating portion 120 in the manufacturing process, and then removing the insertion layer 170.

The thickness of the insertion layer may be formed to be less than the thickness of the insertion layer 123. When the insertion layer 170 is thicker than the piezoelectric layer 123, it is difficult to form the bent portion 123b in which bending is formed along the shape of the insertion layer 170. In addition, when the thickness of the insertion layer 170 is 100 Å or more, it is possible to easily form the bent portion 123b and effectively prevent sound waves in a horizontal direction of the bulk-acoustic resonator, thereby improving the resonator performance.

The resonating portion 120 may be disposed to be spaced apart from the resonator substrate 110 through a cavity C formed as an air space.

The cavity C may be formed by supplying an etching gas (or an etching solution) to an inlet hole (H of FIG. 2, FIG. 4) to remove a portion of a sacrificial layer 140 in the manufacturing process of the bulk-acoustic resonator 100.

A protective layer 127 may be disposed along a surface of the bulk-acoustic resonator 100 to protect the bulk-acoustic resonator 100 from an outside environment. The protective layer 127 may be disposed along the second electrode 125, the bent portion 123b of the piezoelectric layer 123, and the surface formed by the insertion layer 170.

The protective layer 127 may include a first protective layer 127a formed of a silicon oxide based insulating material or a silicon nitride based insulating material, and a second protective layer 127b formed of any one of an aluminum oxide based insulating material, an aluminum nitride based insulating material, a magnesium oxide based insulating material, a titanium oxide based insulating material, a zirconium oxide based insulating material, and a zinc oxide based insulating material.

The second protective layer 127b may be stacked on an upper portion of the first protective layer 127a. The protective layer 127 will be described later in more detail.

The first electrode 121 and the second electrode 125 may be formed to be extended to the outside of the resonating portion 120, and a first metal layer 180 and a second metal layer 190 may be disposed on the upper surface of the extended portions of the first electrode 121 and the second electrode 125, respectively.

The first metal layer 180 and the second metal layer 190 may be formed of a material such as gold (Au), a gold-tin (Au—Sn) alloy, copper (Cu), a copper-tin (Cu—Sn) alloy, aluminum (Al), an aluminum alloy, or the like.

The first metal layer 180 and the second metal layer 190 may function as connection wirings for electrically connecting the electrodes 121 and 125 of the bulk-acoustic resonator 100 and electrodes of other bulk-acoustic resonators disposed adjacent to each other, or may function as external terminals. However, the disclosure is not limited to these examples.

Although an example in which the insertion layer 170 is disposed below the second metal layer 190 is shown in FIG. 3, the disclosure is not limited to this configuration. If necessary, it is also possible to implement a structure in which the insertion layer 170 is removed below the second metal layer 190.

The first metal layer 180 may be bonded to the first electrode 121 through the insertion layer 170 and the protective layer 127.

In addition, as illustrated in FIG. 4, the first electrode 121 may be formed to have an area that is wider than an area of the second electrode 125, and the first metal layer 180 may be formed at the periphery of the first electrode 121.

Accordingly, the first metal layer 180 may be disposed along the periphery of the resonating portion 120, and may be disposed to surround the second electrode 125. However, the disclosure is not limited to this example.

As described above, the second electrode 125 \may be stacked on the piezoelectric portion 123 and the inclined portion 1231 of the piezoelectric layer 123. A portion of the second electrode 125 disposed on the inclined portion 1231 of the piezoelectric layer 123, that is, a second electrode portion 125a disposed in the extension portion E, is not disposed on an entire inclined surface of the inclined portion 1231 but may be disposed on only a portion of the inclined portion 1231.

Figure 6:
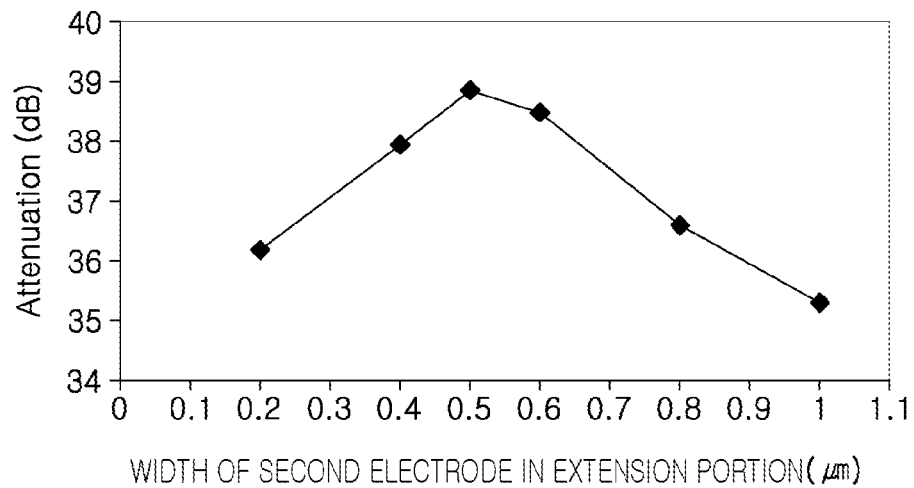
FIG. 6 is a graph illustrating resonance performance of an acoustic resonator according to a second electrode structure of an acoustic resonator, according to an embodiment.

FIG. 6 is a graph illustrating the resonance attenuation of a bulk-acoustic resonator according to a second electrode structure of the bulk-acoustic resonator. That is, FIG. 6 is a graph illustrating attenuation of the bulk-acoustic resonator shown in Tables 3 to 5 in which the thickness of the insertion layer 170 is 3000 Å and the inclination angle (θ) of the inclination surface L is 20°. Attenuation of the bulk-acoustic resonator was measured while changing the size of the second electrode 125a disposed in the extension portion E in the bulk-acoustic resonator having the length of the inclination surface L ($I_s$, or width) of 0.87 μm. In FIG. 5, the greater an attenuation value of the bulk-acoustic resonator, the better the structure that shields sound waves in the horizontal direction performs. The following Table 1 is a table summarizing the values of the graph shown in Table 6.

TABLE 1

| Width of second electrode in extension portion(μm) | Attenuation(dB) | Width of second electrode of extension portion (μm)/Length of inclined surface(μm) |
|---|---|---|
| 0.2 | 36.201 | 0.23 |
| 0.4 | 37.969 | 0.46 |
| 0.5 | 38.868 | 0.575 |
| 0.6 | 38.497 | 0.69 |
| 0.8 | 36.64 | 0.92 |
| 1 | 35.33 | 1.149 |

※ Length of inclined surface: 0.87μm.

Since the inclined surface of the piezoelectric layer 123 is formed to have the same shape as the inclined surface L of the insertion layer L along the inclined surface L, the length of the inclined surface of the piezoelectric layer 123 can be considered to be equal to the length ($I_s$) of the inclined surface L of the insertion layer 170.

Referring to FIG. 6 and Table 1, in the bulk-acoustic resonator in which the length ($I_s$) of the inclined surface of the piezoelectric layer 123 in the extension portion E is 0.87 μm, the attenuation was measured to be greatest when the second electrode 125a is stacked on the inclined surface of the piezoelectric layer 123 with a width of 0.5 μm. It was measured that the attenuation decreases and the resonance performance is deteriorated when a width of the second electrode 125a is greater or less than 0.5 µm in the extension portion E.

Considering a ratio ($W_e/I_s$) of a width ($W_e$) of the second electrode 125 and a length ($I_s$) of the inclined surface in the extension portion E, as illustrated in Table 1, it can be seen that attenuation is maintained to be 37 dB or more when the ratio ($W_e/I_s$) is 0.46 to 0.69.

Therefore, in order to provide the resonance performance, a range of the ratio ($W_e/I_s$) of a maximum width ($W_e$) of the second electrode 125a and the length ($I_s$) of the inclined surface in the extension portion E of the bulk-acoustic resonator 100 may be 0.46 to 0.69. However, the disclosure is not limited to such an example. The range of the ratio $W_e/I_s$ be changed according to the size of the inclination angle (θ) or the thickness change of the insertion layer 170, and may be changed as the resonance frequency of the resonator changes.

According to the result of Table 1, it can be seen that the attenuation characteristic of the bulk-acoustic resonator 100 is better in the case in which an end of the second electrode 125a is disposed on the inclined portion 1231 than the case in which an end of the second electrode 125 is disposed to the extension portion 1232 through the inclined portion 1231.

When a bulk-acoustic resonator is used in a humid environment or is left at room temperatures for an extended period of time of time, a hydroxyl group (OH group) may be adsorbed by a protective layer of the bulk-acoustic resonator, such that frequency variations may increase due to mass loading or resonator performance may be deteriorated.

In order to solve this problem, the protective layer 127 in the bulk-acoustic resonator 127 may be formed by stacking at least two layers 127a and 127b, which are different from each other. In addition, the hydrophobic layer 130 may be disposed on the protective layer 127.

Figure 7:
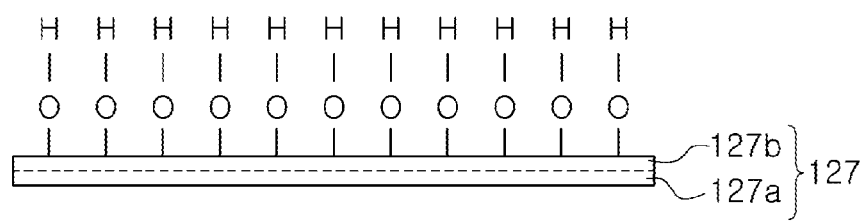
FIG. 7 is a view illustrating a hydroxyl group being adsorbed on a protective layer on which a hydrophobic layer is not formed.
Figure 8:
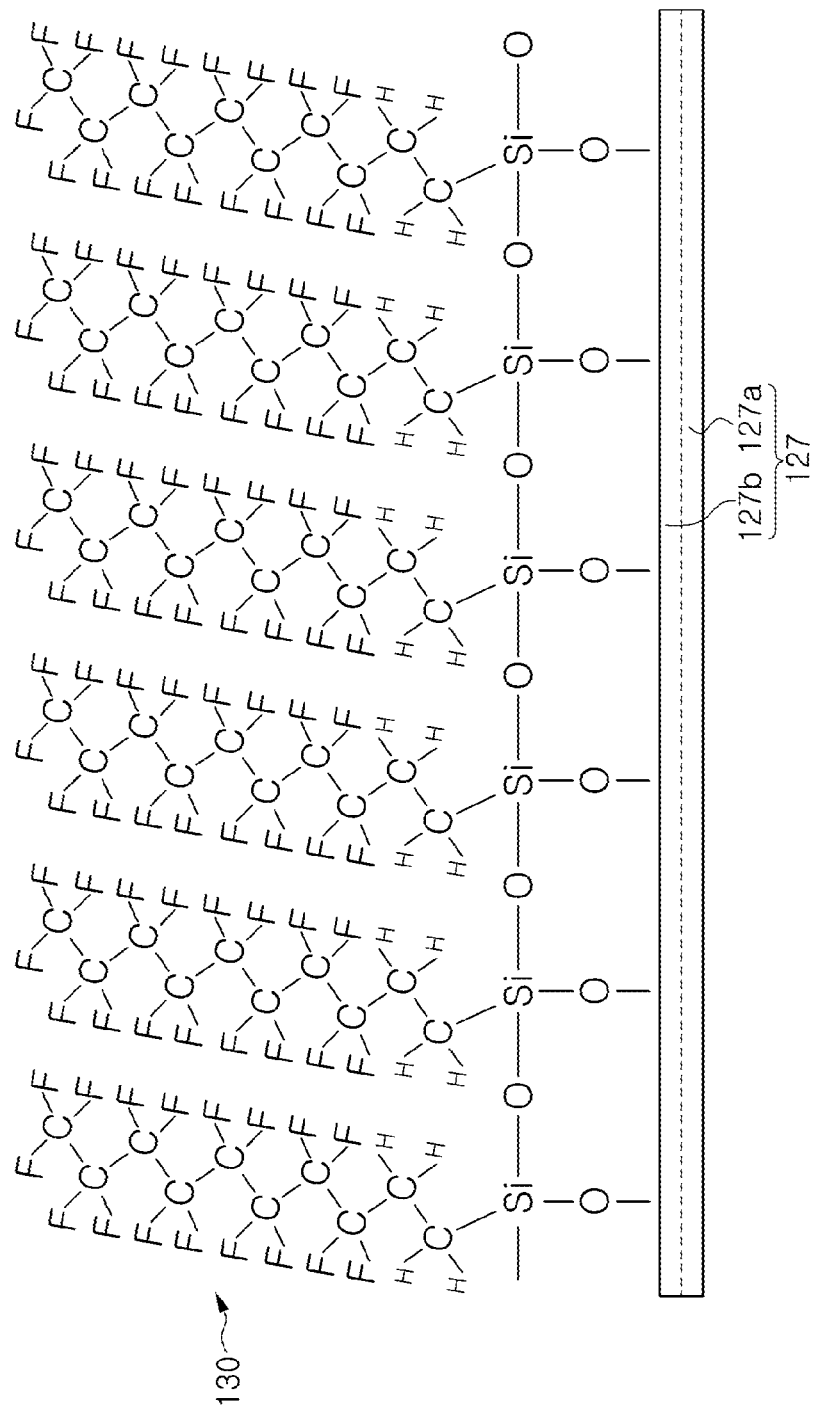
FIG. 8 is a view illustrating a hydrophobic layer formed on a protective layer.

FIG. 7 illustrates that a hydroxyl group is adsorbed on a protective layer on which a hydrophobic layer is not formed, and FIG. 8 illustrates a hydrophobic layer formed on a protective layer.

Referring to FIGS. 7 and 8, the protective layer 127 may include a first protective layer 127a and a second protective layer 127b stacked on the first protective layer 127a. A hydrophobic layer 130 may be disposed on the second protective layer 127b.

As illustrated in FIG. 7, when the hydrophobic layer 130 is not formed on the protective layer 127, when the hydrophobic layer 127 is used in a humid environment or is left at room temperature for an extended period of time of time, a hydroxyl group (OH group) may be more easily adsorbed to the protective layer 127 to form hydroxylate. Since hydroxylate has high surface energy and is stable, mass loading occurs because it attempts to lower the surface energy by adsorbing water, or another fluid.

On the other hand, as illustrated in FIG. 8, when the hydrophobic layer 130 is formed on the protective layer, since the surface energy is low and stable, there is no need to lower the surface energy by adsorbing water, a hydroxyl group (OH group), and the like. Therefore, the hydrophobic layer 130 may serve to suppress adsorption of water, a hydroxyl group (OH group), and the like, thereby significantly reducing frequency variation, and thus maintaining uniform resonator performance.

Figure 9:
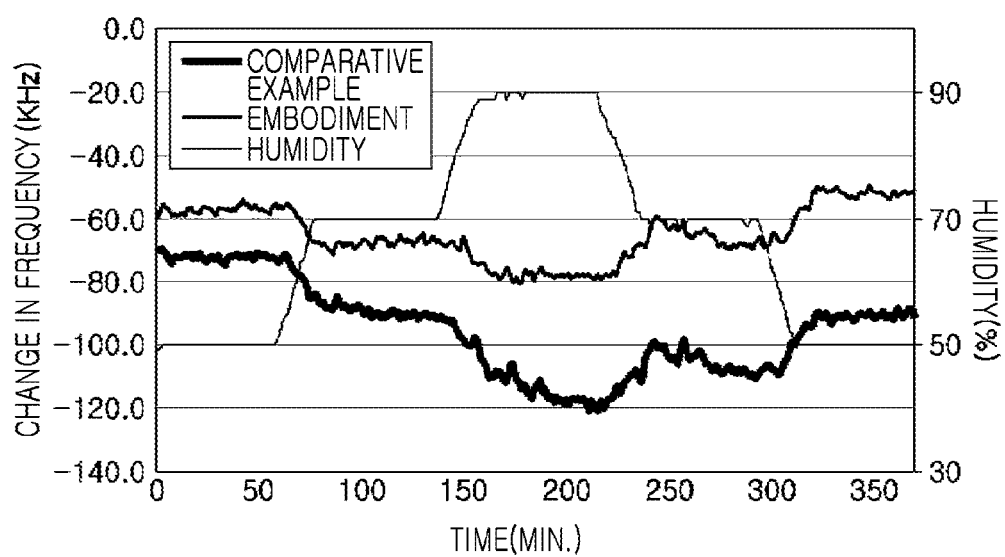
FIG. 9 is a graph illustrating frequency variations according to humidity and time with respect to an acoustic resonator according to an embodiment, in which a hydrophobic layer is formed on a protective layer, and an acoustic resonator according to a comparative example, in which a hydrophobic layer is not formed on a protective layer.

FIG. 9 is a graph illustrating changes in frequency according to humidity and time with respect to a bulk-acoustic resonator according to an embodiment (Embodiment) in which a hydrophobic layer is formed on a protective layer and a bulk-acoustic resonator according to a comparative example (Comparative Example), in which a hydrophobic layer is not formed on a protective layer. In an experimental method, the above-described Embodiment and Comparative Example were placed in a moisture absorption chamber, and the changes in frequency were measured while chaining the humidity as illustrated in FIG. 9.

Referring to FIG. 9, it can be seen that in the case of the bulk-acoustic resonator in which the hydrophobic layer is formed on the protective layer, an amount of frequency change according to the change in humidity and time is much smaller. In addition, in the case of the Embodiment, it can be seen that the amount of frequency change at the end of the experiment is smaller than the amount of frequency change at the start of the experiment.

The hydrophobic layer 130 may be formed of a self-assembled monolayer, not a polymer. When the hydrophobic layer 130 is formed of a polymer, mass due to the polymer affects to the resonating portion 120. However, in the bulk-acoustic resonator 100, since the hydrophobic layer 130 is formed of a self-assembled monolayer, it is possible to significantly reduce changes in frequency of the bulk-acoustic resonator 100.

When a hydrophobic layer is formed of a polymer, the thickness of the hydrophobic layer may become uneven when the hydrophobic layer is formed in the cavity C through inlet holes (H of FIG. 1 and FIG. 3). The thickness of the hydrophobic layer in the cavity C, close to the inlet holes H, may be greater and the thickness of the hydrophobic layer formed in a central portion of the cavity C, far from the inlet holes H, may be less.

In addition, when the polymer has high viscosity, the polymer may not penetrate smoothly into the cavity C such that the hydrophobic layer may not be formed inside the cavity C.

However, since the hydrophobic layer 130 of the bulk-acoustic resonator 100 is formed of a self-assembled monolayer, the thickness of the hydrophobic layer 130 may be uniform according to positions in the cavity C.

Figure 10:
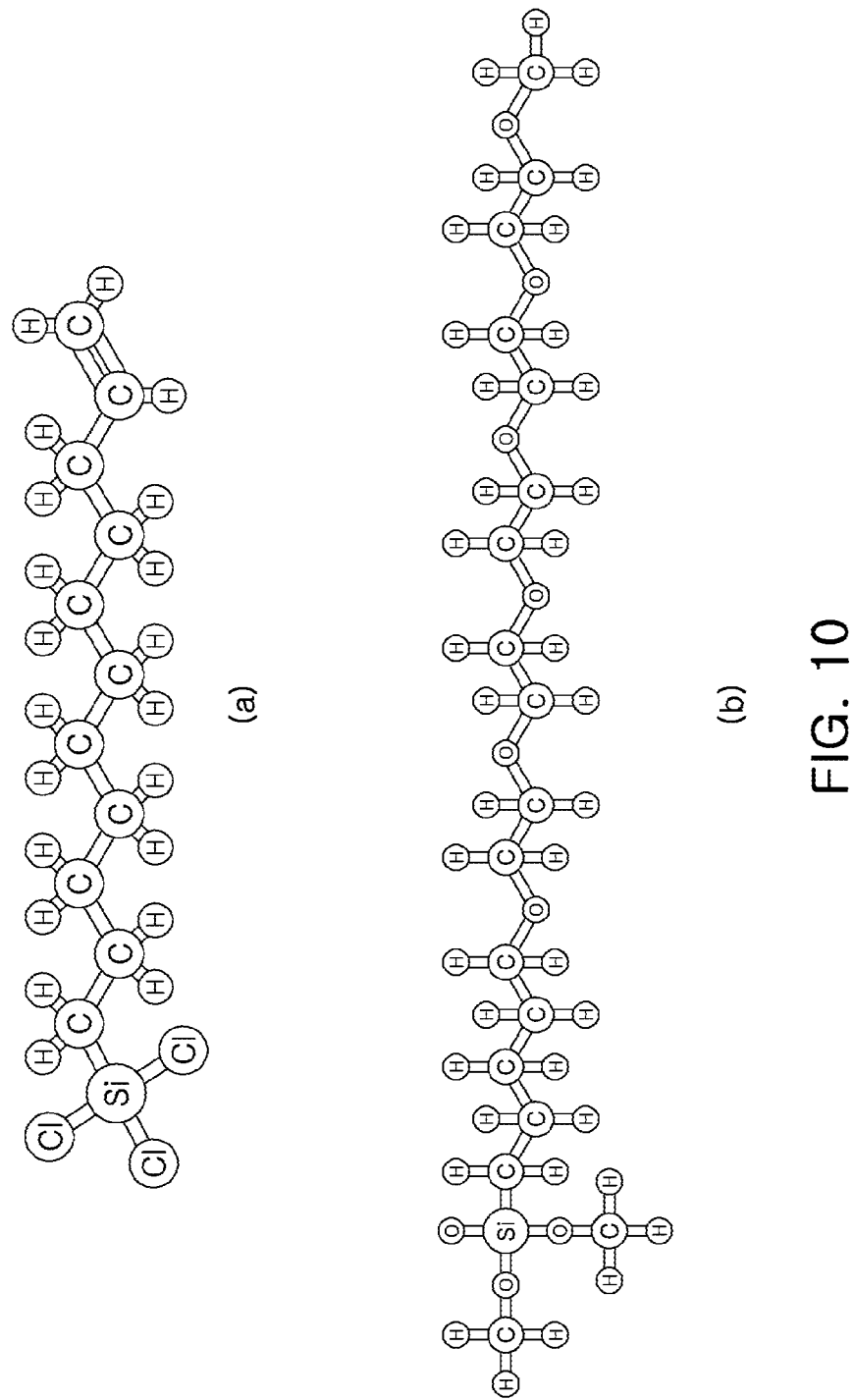
FIG. 10 is a schematic view illustrating a molecular structure of a precursor used as an adhesion layer of a hydrophobic layer, according to an embodiment.

In order to improve adhesion between the self-assembled monolayer constituting the hydrophobic layer 130 and the protective layer 127, a precursor may be used. As illustrated in FIG. 10, the precursor may be a hydrocarbon having a silicon head or siloxane having a silicon head.

Figure 11:
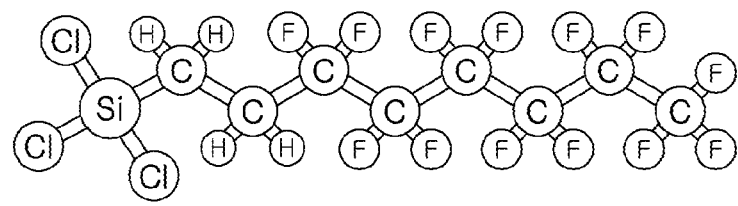
FIG. 11 is a schematic view illustrating a molecular structure of a hydrophobic layer, according to an embodiment.

The hydrophobic layer 130 may be fluorocarbon, referring to FIG. 11, but is not limited thereto. The hydrophobic layer 130 may be formed of a material having a contact angle of 90° or more with water after deposition. For example, the hydrophobic layer 130 may contain a fluorine (F) component, and may include fluorine (F) and silicon (Si).

Since the hydrophobic layer 130 is formed after forming the first metal layer 180 and the second metal layer 190, as described later, the hydrophobic layer 130 may be formed on an upper portion of the protective layer 170, excluding a portion in which the first metal layer 180 and the second metal layer 190 are formed on the protective layer 127.

In addition, the hydrophobic layer 130 may be disposed not only on an upper portion of the protective layer 127, but also on an inner surface of the cavity C.

As described later, the hydrophobic layer 130 formed on the cavity C may be formed at the same time that the hydrophobic layer 130 formed on the protective layer 127 is formed.

The hydrophobic layer 130 formed in the cavity C may be formed on the upper surface of the cavity C, thereby suppressing the adsorption of a hydroxyl group to the resonant portion. Since the adsorption of the hydroxyl group of the resonator occurs not only on the protective layer 127, but also on the upper surface of the cavity C, in order to prevent the frequency drop due to mass loading due to the adsorption of hydroxyl group, it is desirable to prevent the adsorption of the hydroxyl group on the protective layer 127 and the upper surface of the cavity C. In addition, the hydrophobic layer 130 may be formed not only on the upper surface of the cavity C, but also on at least a portion or an entirety of the lower surface and the side surface of the cavity C.

In addition, the protective layer 127 may include the first protective layer 127a disposed along a surface below which the second electrode 125, the bent portion 123b of the piezoelectric layer 123, and the insertion layer 170 are formed, and the second protective layer 127b stacked on the first protective layer 127a.

The first protective layer 127a may be used for frequency trimming and may be made of a material suitable for the frequency trimming. For example, the first protective layer 127a may be formed of any one of silicon dioxide ($SiO_2$), silicon nitride ($Si_3N_4$), amorphous silicon (a-Si), and polycrystalline silicon (p-Si).

In the case of silicon dioxide ($SiO_2$), silicon nitride ($Si_3N_4$), amorphous silicon (a-Si), and polycrystalline silicon (p-Si), there may be a disadvantage that the adsorption of the hydroxyl group easily occurs in a wet process, which is a subsequent process. The reason for this result is that, because, a film quality of thin films such as silicon dioxide ($SiO_2$), silicon nitride ($Si_3N_4$), amorphous silicon (a-Si) and polycrystalline silicon (p-Si) is not dense, there are many sites in which the adsorption of hydroxyl group may occur not only on the surface but also inside the thin films. Therefore, in the bulk-acoustic resonator 100, the second protective layer 127b may be formed by stacking a material that resists absorption of a hydroxyl group on the first protective layer 127a.

Accordingly, the second protective layer 127b may be made of a material having high density. For example, the second protective layer 127b may be made of any one of aluminum oxide ($Al_2O_3$), aluminum nitride (AlN), magnesium oxide (MgO), titanium oxide (TiO2), zirconium oxide (ZrO2), and zinc oxide (ZnO).

Since the second protective layer 127b has a more dense film quality than the first protective layer 127a, the adsorption of a hydroxyl group may occur only on the surface of the second protective layer 127b.

The first protective layer 127a was formed of silicon dioxide ($SiO_2$) having a thickness of 2000 Å and a reliability test was performed in a high temperature, high humidity, and high pressure environment without a hydrophobic layer, and as a result, an amount of frequency variation of the resonating portion 120 was measured to be 0.9 Mhz. It was measured that the amount of frequency variation of the resonating portion 120 is 0.7 Mhz when a hydrophobic layer is formed on the above-described first protective layer 127a.

In addition, a reliability test was performed when the first protective layer 127a was formed of silicon nitride ($Si_3N_4$) having a thickness of 2000 Å, without the hydrophobic layer. As a result, it was measured that the amount of frequency variation of the resonating portion 120 is 0.7 Mhz, and it was measured that the amount of frequency variation measured after forming the hydrophobic layer is 0.5 Mhz.

On the other hand, when the first protective layer 127a is formed of silicon nitride ($Si_3N_4$) having a thickness of 2000 Å, and the second protective layer 127b is formed of aluminum oxide ($Al_2O_3$) having a thickness of 500 Å, and the hydrophobic layer is disposed on the second protective layer 127b, it was measured that the amount of frequency variation of the resonating portion 120 is 0.3 Mhz.

Therefore, it can be seen that the amount of frequency variation is remarkably improved when the protective layer 127 is formed of a plurality of layers, and the hydrophobic layer 130 is stacked thereon.

When the amount of frequency variation is about 0.3 Mhz as a result of the reliability test, it is not necessary to seal the resonating portion 120 in order to block penetrating moisture into the resonating portion 120. Therefore, it is not necessary to add additional components in order to provide airtightness of the resonating portion 120.

FIGS. 12 to 15 are explanatory diagrams for explaining a manufacturing method of the bulk-acoustic resonator 100, according to an embodiment.

Figure 12:
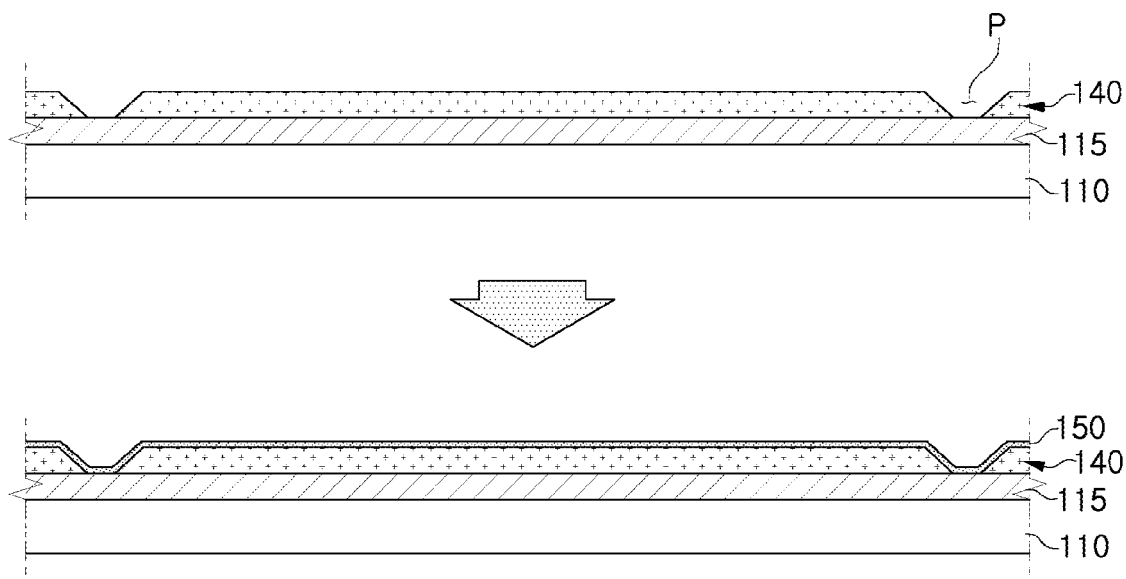
FIGS. 12 to 15 are views illustrating a manufacturing method of an acoustic resonator, according to an embodiment.

Referring to FIG. 12, a manufacturing method of the bulk-acoustic resonator 100 includes steps of forming the insulating layer 115 and the sacrificial layer 140 on the resonator substrate 110, and forming a pattern P penetrating the sacrificial layer 140. Therefore, the insulating layer 115 may be exposed to the outside environment through the pattern P.

The insulating layer 115 may be formed of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), silicon nitride ($Si_3N_4$), or silicon dioxide ($SiO_2$), but is not limited to these examples.

The pattern P may be formed to have a trapezoidal cross-section having a width on an upper surface that is wider than a width on the lower surface.

The sacrificial layer 140 may be partially removed through a subsequent etching process to form the cavity C (FIG. 3). Therefore, the sacrificial layer 140 may be made of a material such as polysilicon, polymer, or the like, but is not limited to these examples.

Subsequently, the membrane layer 150 may be formed on the sacrificial layer 140. The membrane layer 150 may be formed with a constant thickness along the surface of the sacrificial layer 140. The thickness of the membrane layer 150 may be less than the thickness of the sacrificial layer 140.

The membrane layer 150 may include either one or both of silicon dioxide ($SiO_2$) and silicon nitride ($Si_3N_4$). In addition, the membrane layer 150 may be made of a dielectric layer containing any one or any combination of any two or more of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) or may be formed of a metal layer containing at least one of aluminum (Al), nickel (Ni), chrome (Cr), platinum (Pt), gallium (Ga), hafnium (Hf), and titanium (Ti). However, the disclosure is not limited to these examples.

Although not illustrated, a seed layer may be formed on the membrane layer 150.

The seed layer may be disposed between the membrane layer 150 and a first electrode 121, to be described later. The seed layer may be manufactured of aluminum nitride (AlN), but is not limited thereto. The seed layer may be formed using a dielectric and metal having an HCP structure. For example, when metal is used to form the seed layer, the seed layer may be formed of titanium (Ti).

Figure 13:
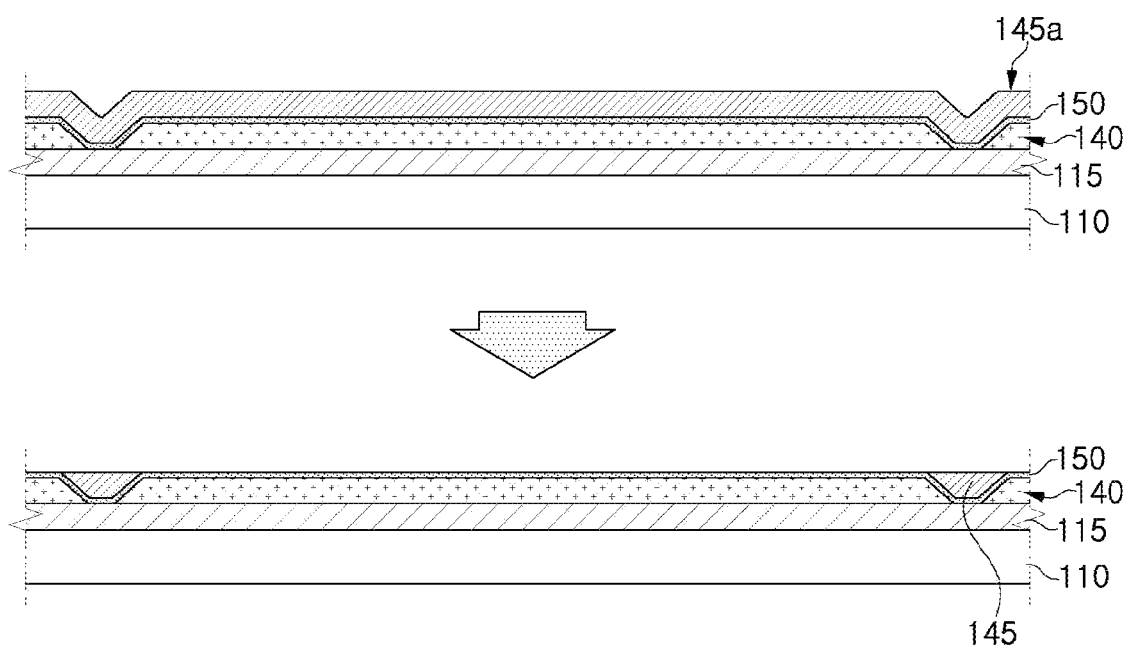

Subsequently, as illustrated in FIG. 13, an etch stop layer 145a may be formed on the membrane layer 150. The etch stop layer 145a may also be filled in the pattern P.

The etch stop layer 145a may be formed to have a thickness that completely fills the pattern P. Therefore, the etch stop layer 145a may be formed to be thicker than the sacrificial layer 140.

The etch stop layer 145a may be formed of the same material as the insulating layer 115, but is not limited thereto.

Subsequently, the etch stop layer 145a may be partially removed such that the membrane layer 150 is exposed to the outside. In this case, the portion of the etch stop layer 145a filled in the pattern P may remain, and may form the etch stop portion 145.

Figure 14:
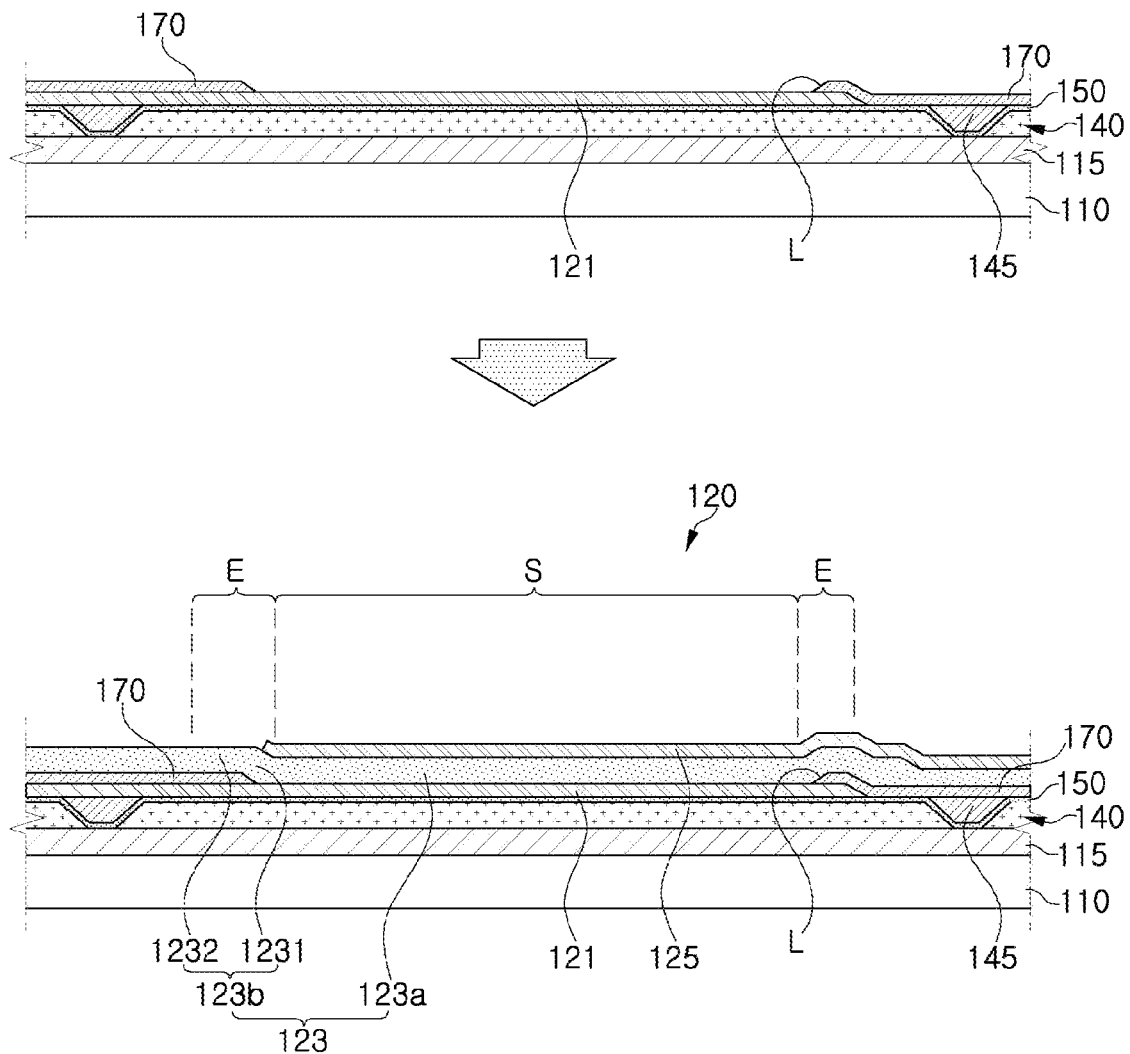

Subsequently, as illustrated in FIG. 14, the first electrode 121 may be formed on the upper surface of the membrane layer 150.

The first electrode 121 may be formed of a conductive material, such as gold (Au), molybdenum (Mo), ruthenium (Ru), iridium (Ir), aluminum (Al) platinum (Pt), titanium (Ti), tungsten (W), palladium (Pd), tantalum (Ta), chromium (Cr), nickel (Ni) or a metal including any one or any combination of any two or more of gold (Au), molybdenum (Mo), ruthenium (Ru), iridium (Ir), aluminum (Al) platinum (Pt), titanium (Ti), tungsten (W), palladium (Pd), tantalum (Ta), chromium (Cr), nickel and (Ni). However, the first electrode 121 is not limited to the listed materials.

The first electrode 121 may be formed on the upper portion of a region in which the cavity C (FIG. 3) is to be formed.

The first electrode 121 may be formed by forming a conductive layer covering the entirety of the membrane layer 150, and then removing unnecessary portions of the conductive layer.

Subsequently, the insertion layer 170 may be formed, if necessary. The insertion layer 170 may be formed on the first electrode 121, and may be extended to the upper portion of the membrane layer 150. When the insertion layer 170 is formed, the extension portion 123b of the resonating portion 120 is formed to be thicker than the central portion 123a, such that vibrations generated in the resonating portion 120 are prevented from leaking to the outside, such that a Q-factor may be improved.

The insertion layer 170 may be formed to cover the entirety of the surface formed by the membrane layer 150 and the first electrode 121 and the etch stop portion 145, and then may be completed by removing a portion disposed in a region corresponding to the central portion S.

Accordingly, a central portion of the first electrode 121 corresponding to the central portion S may be exposed to the outside of the insertion layer 170. In addition, the insertion layer 170 may be formed to cover a portion of the first electrode 121 along the periphery of the first electrode 121. Therefore, a rim portion of the first electrode 121 disposed in the extension portion E may be disposed under the insertion layer 170.

A side surface of the insertion layer 170 disposed adjacent to the central portion S may be formed of an inclined surface L. The insertion layer 170 may be formed to be thinner toward the central portion S. Accordingly, the lower surface of the insertion layer 170 may be formed in a more extended form toward the central portion S than the upper surface of the insertion layer 170. In this case, the inclination angle of the inclined surface L of the insertion layer 170 may be formed in a range of 5° to 70°, as described above.

The insertion layer 170 may be formed of a dielectric material such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), zinc oxide (ZnO), or the like, but may be formed of a material different from that of the piezoelectric layer 123.

Subsequently, the piezoelectric layer 123 may be formed on the first electrode 121 and the insertion layer 170.

The piezoelectric layer 123 may be formed of aluminum nitride (AlN). However, the piezoelectric layer 123 is not limited to AlN, and zinc oxide (ZnO), aluminum nitride (AlN), doped aluminum nitride, lead zirconate titanate, quartz, or the like, may be selectively used as a material of the piezoelectric layer 123. The doped aluminum nitride may further include a rare earth metal, a transition metal, or an alkaline earth metal. As an example, the rare earth metal may include any one or any combination of any two or more of scandium (Sc), erbium (Er), yttrium (Y), and lanthanum (La), and the rare earth metal content may be 1 to 20 at %. The transition metal may include any one or any combination of any two or more of hafnium (Hf), titanium (Ti), zirconium (Zr), tantalum (Ta), and niobium (Nb). In addition, the alkaline earth metal may include magnesium (Mg).

In addition, the piezoelectric layer 123 may be formed of a material different from that of the insertion layer 170.

The piezoelectric layer 123 may be formed by forming a piezoelectric material on an entire surface formed by the first electrode 121 and the insertion layer 170, and then partially removing unnecessary portions of the piezoelectric material. In the embodiment of FIGS. 12-15, the unnecessary portions of the piezoelectric material are removed, after the second electrode 125 is formed, to complete the piezoelectric layer 123. However, it is also possible to complete the piezoelectric layer 123 before forming the second electrode 125.

The piezoelectric layer 123 may be formed to cover portions of the first electrode 121 and the insertion layer 170, and thus the piezoelectric layer 123 may be formed along the shape formed by the first electrode 121 and the insertion layer 170.

As described above, only a portion of the first electrode 121 corresponding to the central portion S may be exposed to the outside of the insertion layer 170. Therefore, the portion of the piezoelectric layer 123 formed on the first electrode 121 may be located in the central portion S. The bent portion 123b formed on the insertion layer 170 may be located in the extension portion E.

Subsequently, the second electrode 125 may be formed on the piezoelectric layer 123. The second electrode 125 may be formed of a conductive material such as gold, molybdenum, ruthenium, iridium, aluminum, platinum, titanium, tungsten, palladium, tantalum, chromium, nickel, or metal including any one or any combination of any two or more of gold, molybdenum, ruthenium, iridium, aluminum, platinum, titanium, tungsten, palladium, tantalum, chromium, and nickel, but is not limited to these examples.

The second electrode 125 may be mostly formed on the piezoelectric portion 123a of the piezoelectric layer 123. As described above, the piezoelectric portion 123a of the piezoelectric layer 123 may be located in the central portion S. Therefore, the portion of the second electrode 125 disposed on the piezoelectric layer 123 may also be disposed in the central portion S.

In addition, the second electrode 125 may be further formed on the inclined portion 1231 of the piezoelectric layer 123. As described above, the second electrode 125 may be disposed in the entirety of the central portion S and partially in the extension portion E. By partially disposing the second electrode 125 in the extension portion 123b, it is possible to provide remarkably improved resonance performance.

Figure 15:
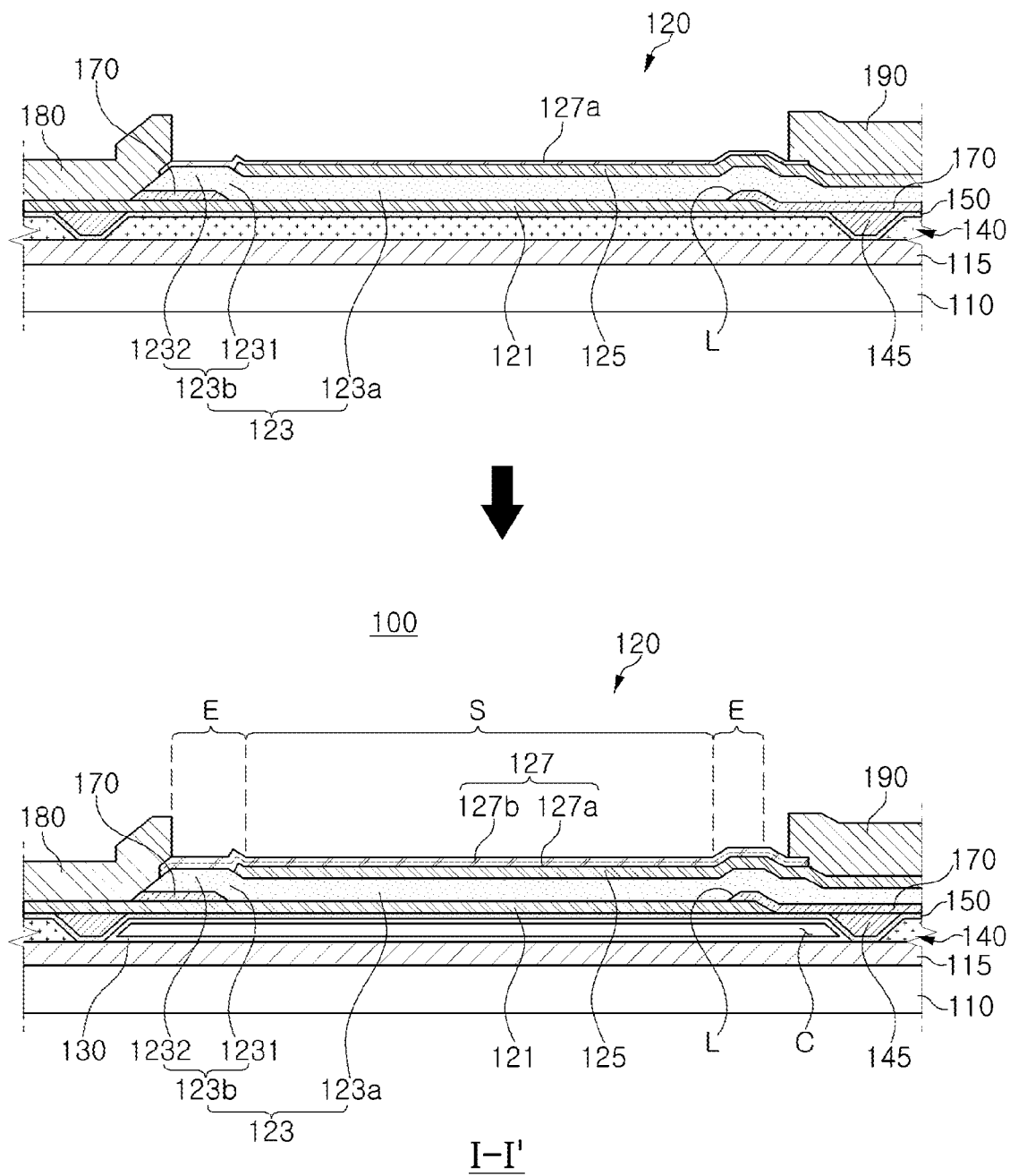

Subsequently, as illustrated in FIG. 15, the first protective layer 127a may be formed.

The first protective layer 127a may be formed along the surface formed by the second electrode 125 and the piezoelectric layer 123. In addition, although not shown, the first protective layer 127a may also be formed on the externally exposed portion of the insertion layer 170.

The first protective layer 127a may be formed of either one of a silicon oxide based insulating material and a silicon nitride based insulating material, but is not limited to these examples.

For example, the first protective layer 127a may be formed of any one of silicon dioxide ($SiO_2$), silicon nitride ($Si_3N_4$), amorphous silicon (a-Si), and polycrystalline silicon (p-Si).

Subsequently, the first protective layer 127a and the piezoelectric layer 123 may be partially removed to partially expose the first electrode 121 and the second electrode 125, and a first metal layer 180 and a second metal layer 190 may be formed on the exposed portions of the first electrode 121 and the second electrode 125, respectively.

The first metal layer 180 and the second metal layer 190 may be formed of a material such as gold (Au), a gold-tin (Au—Sn) alloy, copper (Cu), a copper-tin (Cu—Sn) alloy, aluminum (Al), an aluminum alloy, or the like, and may be deposited on the first electrode 121 or the second electrode 125 in a desired form. However, the first electrode 121 and the second electrode 125 are not limited to the example materials.

Subsequently, the cavity C may be formed by removing a portion of the sacrificial layer 140 located inside the etch stop portion 145, and the portion of the sacrificial layer 140 removed in this process may be removed by an etching method.

When the sacrificial layer 140 is formed of a material such as polysilicon or polymer, the sacrificial layer 140 may be removed by a dry etching method using a halide-based etching gas (for example, $XeF_2$) such as fluorine (F) or chlorine (Cl), or the like.

Subsequently, a trimming process partially removing a first protective layer 127a through a wet process may be performed to obtain a target frequency characteristic.

When the trimming process is completed, a process of stacking a second protective layer 127b on the first protective layer 127a may be performed. As described above, a material having a higher density than that of the first protective layer 127a may be used in the second protective layer 127b. For example, aluminum oxide ($Al_2O_3$) may be used in the second protective layer 127b. However, the disclosure is not limited to this example.

The second protective layer 127b may be formed to have a thickness that is less than the thickness of the first protective layer 127a, and may be formed by a vapor deposition method, or the like.

Subsequently, the hydrophobic layer 130 may be formed on the second protective layer 127b to complete the bulk-acoustic resonator 100 illustrated in FIGS. 3 and 4.

The hydrophobic layer 130 may be formed by depositing a hydrophobic material by a chemical vapor deposition (CVD) method.

Figure 16:
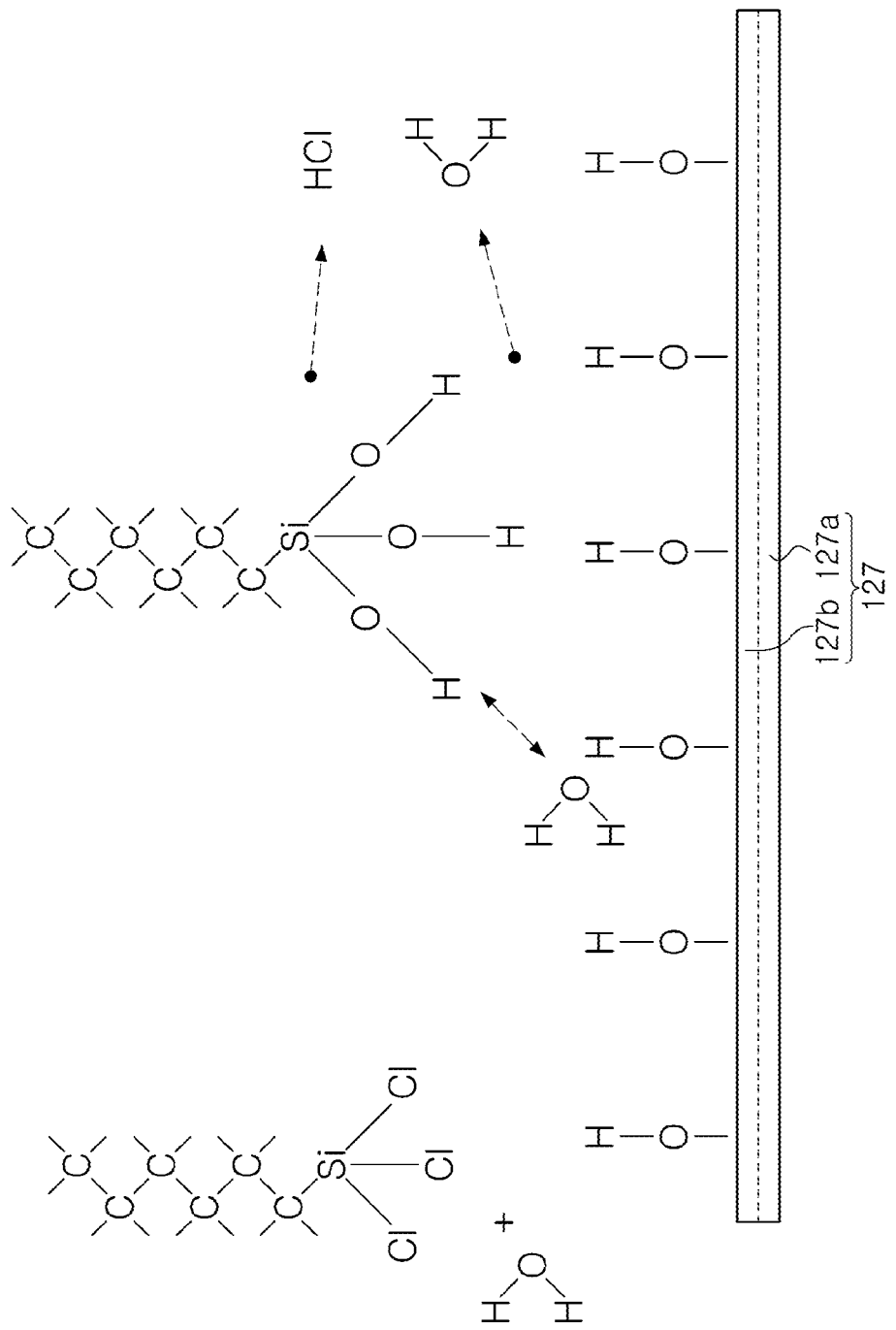
FIG. 16 is a schematic view illustrating a process in which a hydrophobic layer is formed on a protective layer, according to an embodiment.

As illustrated in FIG. 16, hydroxylate is formed on the surface of the second protective layer 127b, and by using a precursor having a silicon head, a hydrolyzed silane reaction is performed to the hydroxylate such that the surface of the protective layer 127 is surface-treated.

Thereafter, when a fluorocarbon functional group is formed on a surface of the surface-treated protective layer 127, the hydrophobic layer 130 may be formed on the protective layer 127 as illustrated in FIG. 8.

It is also possible to form the hydrophobic layer 130 by directly forming the fluorocarbon functional group on the protective layer 127, omitting the surface treatment, depending on the material of the protective layer.

The hydrophobic layer 130 may be formed on the entire surface of the bulk-acoustic resonator 100, but the hydrophobic layer 130 may be formed on only part of the surface of the bulk-acoustic resonator 100, if necessary.

For example, the hydrophobic layer 130 may be formed on an upper surface of the cavity C through inlet holes H (FIGS. 2 and 4) in the above-described hydrophobic layer formation step. In addition, the hydrophobic layer 130 may also be formed on at least a portion of the upper surface and the lower surface and the side surface of the cavity C, and it is also possible to form the hydrophobic layer 130 on the entirety of the upper surface, the lower surface, and the side surface of the cavity C.

In addition, by forming the hydrophobic layer 130 as a self-assembled monolayer, rather than a polymer, it is possible to prevent a mass load due to the hydrophobic layer 130 from being applied to the resonant portion 120, and the thickness of the hydrophobic layer 130 may be uniform.

Hereinafter, modified embodiments of a bulk-acoustic resonator will be described.

Figure 17:
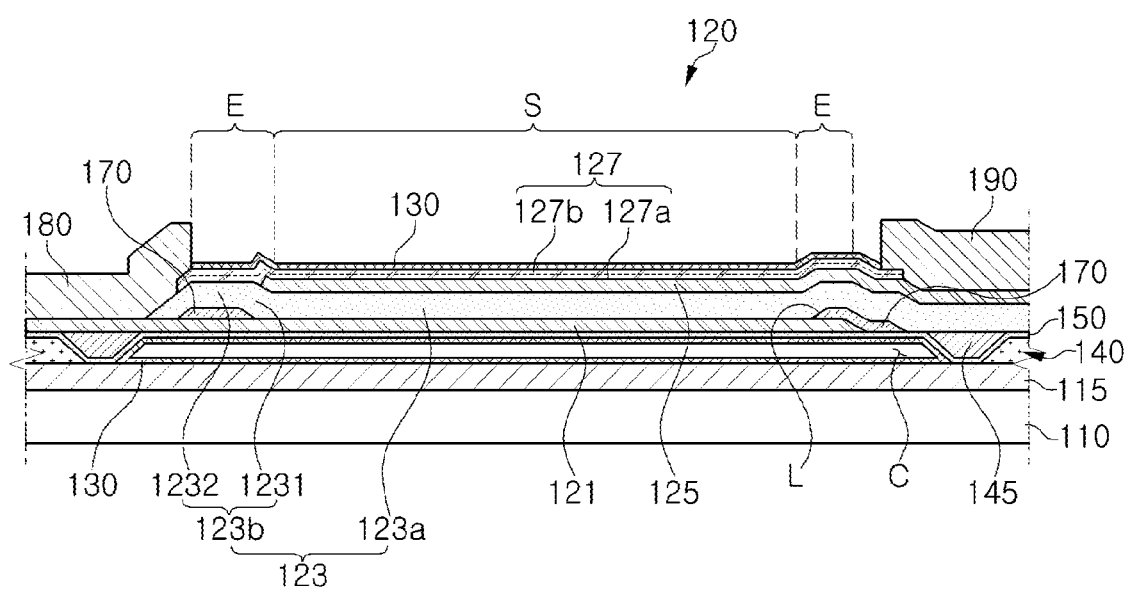
FIGS. 17 and 18 are schematic cross-sectional views illustrating an acoustic resonator, according to an embodiment.
Figure 18:
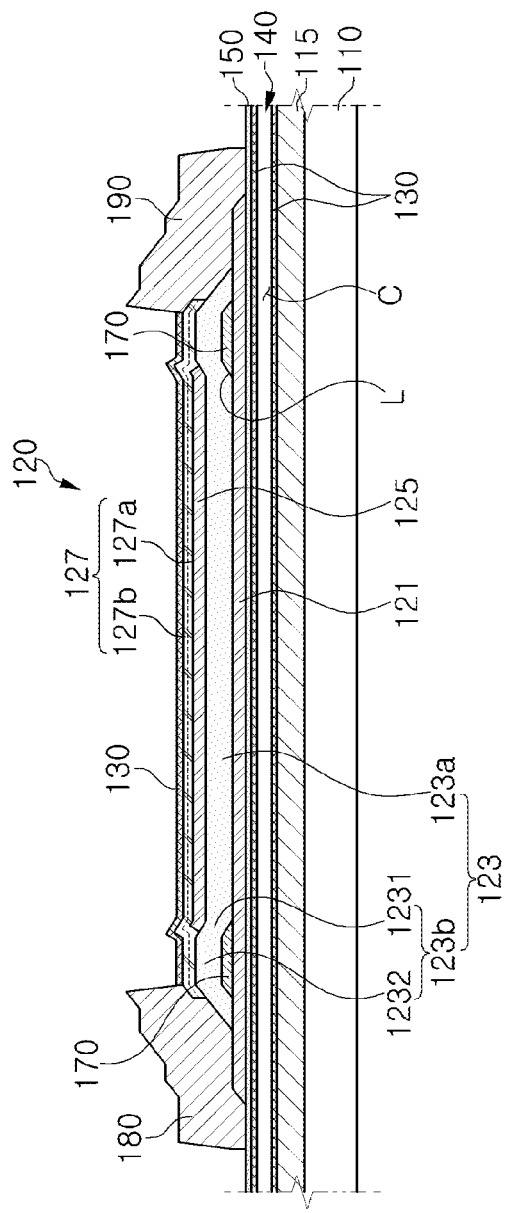

FIGS. 17 and 18 are schematic cross-sectional views illustrating a bulk-acoustic resonator according to a modification of the embodiment of FIGS. 2-5. That is, FIG. 17 is a cross-sectional view corresponding to I-I' of FIG. 2, and FIG. 18 is a cross-sectional view corresponding to II-II' of FIG. 2.

Referring to FIGS. 17 and 18, only a portion of the insertion layer 170 supporting the piezoelectric layer 123 in the resonating portion 120 remains in the bulk acoustic wave resonator, and all remaining portions are removed. Thus, the insertion layer 170 may be partially provided in comparison to the embodiment of FIGS. 2-5, if necessary.

When the bulk-acoustic resonator is configured as illustrated in FIGS. 17 and 18, the insertion layer 170 may be disposed so as not to contact the first metal layer 180 or the etch stop portion 145. In addition, the insertion layer 170 may not be disposed outside of the resonating portion 120, and may be disposed in the upper region of the cavity C. However, a region in which the insertion layer 170 may be is disposed is not limited to the regions illustrated in FIGS. 17 and 18, and may be extended to various positions if necessary.

Figure 19:
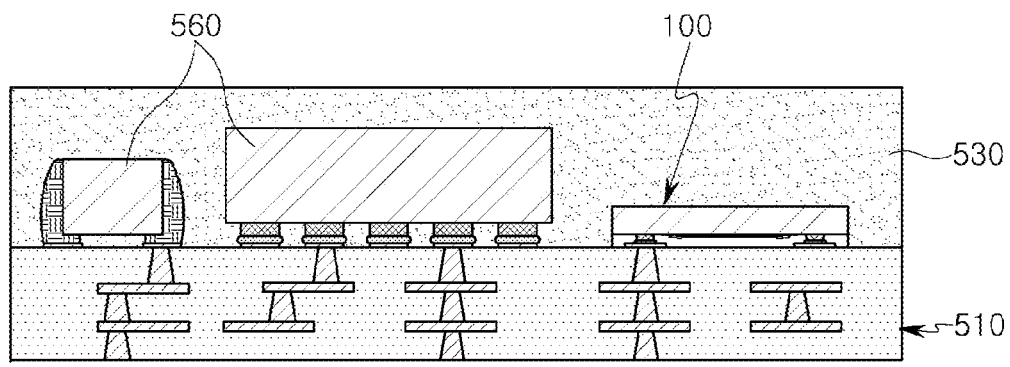
FIG. 19 illustrates a modified example of the acoustic resonator module shown in FIG. 1.

FIG. 19 is a schematic cross-sectional view illustrating a modified example of the bulk-acoustic resonator module 500 illustrated in FIG. 1.

As illustrated in FIG. 19, the bulk-acoustic resonator module may be configured in a package form in which at least one electronic device 560 is mounted in addition to the bulk-acoustic resonator 100.

Figure 20:
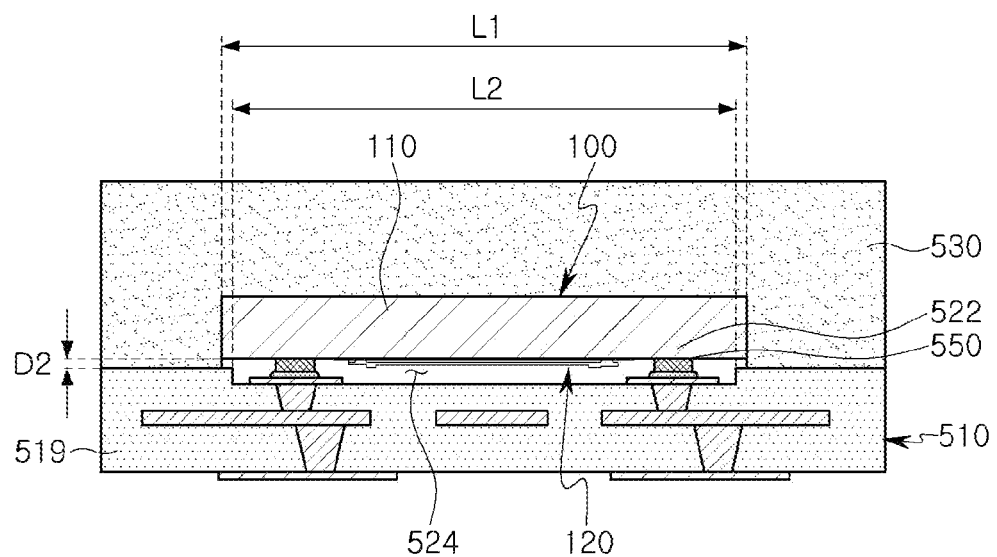
FIG. 20 is a schematic cross-sectional view illustrating a bulk-acoustic resonator module, according to an embodiment.

FIG. 20 is a schematic cross-sectional view illustrating a bulk-acoustic resonator module, according to another embodiment. FIG. 12 illustrates a modified example of the bulk-acoustic resonator module illustrated in FIG. 20.

Referring to FIG. 20, in the bulk-acoustic resonator module, a trench 524 may be formed on one surface of the module substrate 510, and the bulk-acoustic resonator 100 may be disposed in the trench 524.

In this embodiment, a horizontal area of the trench 524 may be formed to be smaller than a horizontal area of the bulk-acoustic resonator 100. For example, in the cross-sectional view of FIG. 20, a horizontal length L2 of the trench 524 may be configured to be less than a horizontal length L1 of the bulk-acoustic resonator 100 by 10 µm or more.

According to the configuration described above, a rim portion of a lower surface of the bulk-acoustic resonator 100 may be disposed to be closely adjacent to an upper surface of the module substrate 510. In this embodiment, the lower surface of the bulk-acoustic resonator 100 may be disposed to be spaced apart from the upper surface of the module substrate 510.

A shortest distance D2 between the rim portion of the lower surface of the bulk-acoustic resonator 100 and the upper surface of the module substrate 510 may be in a range of 0 µm to 20 µm. Thus, it is possible to prevent a module resin from flowing into the trench 524 through a gap between the bulk-acoustic resonator 100 and the upper surface of the module substrate 510 when the sealing portion 530 is formed.

However, the configuration of the disclosure is not limited to the example described above, and various modifications may be made. For example, the rim portion of the lower surface of the bulk-acoustic resonator 100 may be configured to be in contact with the upper surface of the module substrate 510, if necessary.

In addition, the depth of the trench 524 may be in a range of 20 µm to 30 µm, but is not limited thereto.

It is also possible that the bulk-acoustic resonator module may be formed such that the horizontal area of the trench 524 is formed to be larger than the horizontal area of the bulk-acoustic resonator 100, if necessary. In this case, the shortest distance between the rim portion of the lower surface of the bulk-acoustic resonator 100 and the module substrate 510-1 may be in the range of 0 µm to 20 µm. In addition, it is also possible that the at least a portion of the module substrate 510 may be disposed to be in the trench 524, if necessary.

Figure 21:
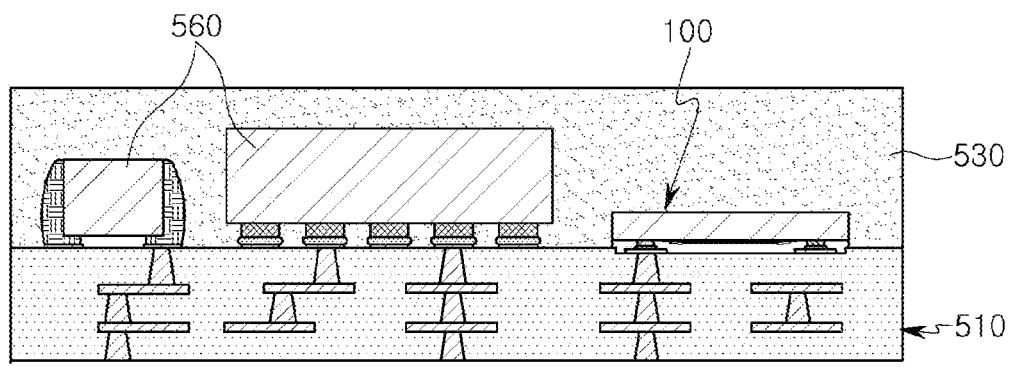
FIG. 21 illustrates a modified example of the acoustic resonator module shown in FIG. 20.

The bulk-acoustic resonator module may be configured as a single package form including only the bulk-acoustic resonator 100 as illustrated in FIG. 20, but is not limited to such an example. As illustrated in FIG. 21, the bulk-acoustic resonator module may be configured as a package form in which at least one electronic device 560 is mounted on the module substrate 510-1 in addition to the bulk-acoustic resonator 100.

Figure 23:
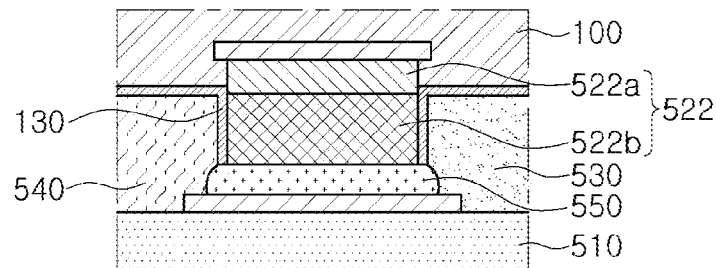
FIG. 23 is a partial enlarged view illustrating portion A of FIG. 22.

FIG. 22 is a schematic cross-sectional view of a bulk-acoustic resonator module, according to another embodiment. FIG. 23 is a partial enlarged view enlarging portion A of FIG. 22.

Referring to FIGS. 22 and 23, the bulk-acoustic resonator 100 according may include a blocking member 540.

In the case of the above-described embodiments, the shortest distance between the module substrate 510 and the bulk-acoustic resonator 100 may be significantly reduced to block inflow of the molding resin. However, the distance between the module substrate 510 and the bulk-acoustic resonator 100 may not be specified and the blocking member 540 may be used.

The blocking member 540 may be disposed between the bulk-acoustic resonator 100 and the module substrate 510 to block the molding resin from flowing between the resonating portion 120 and the module substrate 510 when the sealing portion 530 is manufactured. Therefore, the blocking member 540 may be disposed on an entire circumference of the resonating portion 120 in a manner to surround the resonating portion 120.

The blocking member 540 may be formed of a material having insulation. For example, the blocking member 540 may be formed of a polymer material, but is not limited thereto.

The blocking member 540 may be formed in a manufacturing process of the bulk-acoustic resonator 100. For example, after a process forming the hydrophobic layer 130 of FIG. 3 in the bulk-acoustic resonator 100, the blocking member 540 may be formed by stacking an insulating film on the surface of the bulk-acoustic resonator 100 in which the resonating portion 120 of FIG. 3 is formed, and by patterning the insulating film.

As described above, when the hydrophobic layer 130 is formed in the bulk-acoustic resonator 100, the blocking member 540 having the polymer material may not be firmly coupled onto the bulk-acoustic resonator 100 by the hydrophobic layer 130.

Therefore, in this case, an attaching position of the insulating film may be changed in the process of patterning the insulating film or in the process of mounting the bulk-acoustic resonator on the module substrate 510.

Thus, in order to suppress the movement of the insulating film, the blocking member 540 may be disposed so as to be in contact with at least one connection terminal 522.

At least a portion of the side surface of the connection terminal 522 may be bonded to the blocking member 540 to suppress the movement of the blocking member 540. Therefore, the insulating film may be patterned to be connected to at least one connection terminal 522 in the above-described patterning process.

However, the disclosure is not limited to the example above. For example, when the insulating film is formed on the module substrate 510, without being formed on the bulk-acoustic resonator 100, the insulating film may be firmly stacked on the module substrate 510. Therefore, in this case, since the insulating film is stably and fixedly disposed, the blocking member 540 may be disposed to be spaced apart from the connection terminal 522 of the bulk-acoustic resonator 100.

Referring to FIG. 23, the hydrophobic layer 130 may be formed on the entire surface of the bulk-acoustic resonator, as described above, and accordingly, the hydrophobic layer 130 may also be disposed on the surface of the connection terminal 522. Thus, when the hydrophobic layer 130 is disposed on the surface of the connection terminal 522, the surface of the connection terminal 522 may be prevented from being oxidized.

The hydrophobic layer 130 may also be disposed at the end of the connection terminal 522 in the process of forming the hydrophobic layer 130, but this the portion of the hydrophobic layer 130 at the end of the connection terminal 522 may be removed in the process of mounting the connection terminal 522 on the module substrate 510. Therefore, only a conductive adhesive 550 may be interposed between the end of the connection terminal 522 and the module substrate 510, without the hydrophobic layer 130.

The blocking member 540 may be disposed between the connection terminal 522 and the bulk-acoustic resonator 100. Thus, the blocking member 540 may be bonded to the inner side surface (side surface facing the resonating portion) of the connection terminal 522. A sealing portion 530 may be filled outside of the connection terminal 522, and the sealing portion 530 may be bonded to the outer side surface of the connection terminal 522. However, the disclosure is not limited to such a configuration.

FIGS. 24 to 29 are cross-sectional views illustrating modified embodiments of the bulk-acoustic resonator module illustrated in FIG. 22, respectively.

Figure 24:
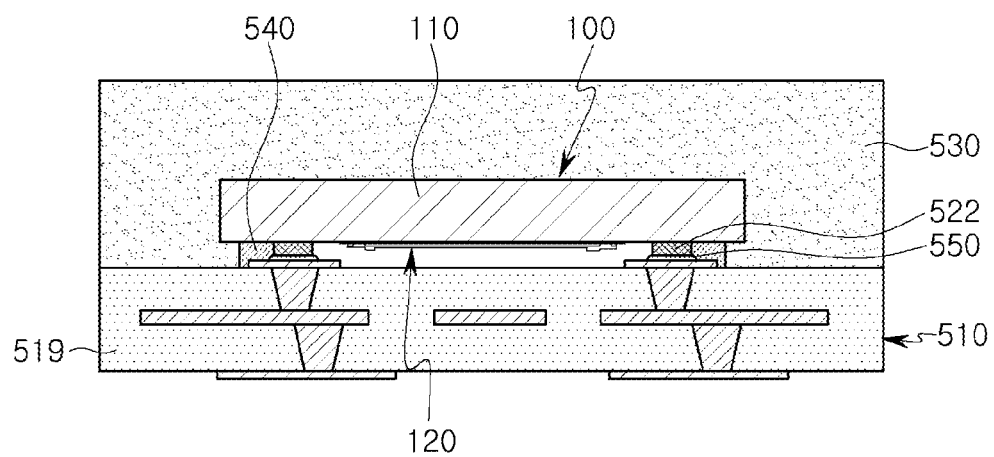
FIGS. 24 to 29 are cross-sectional views illustrating a modified example of the acoustic resonator module shown in FIG. 22.

In the bulk-acoustic resonator module illustrated in FIG. 24, the blocking member 540 may be disposed outside of the connection terminal 522, and thus may be bonded to the outer side surface of the connection terminal 522.

Figure 25:
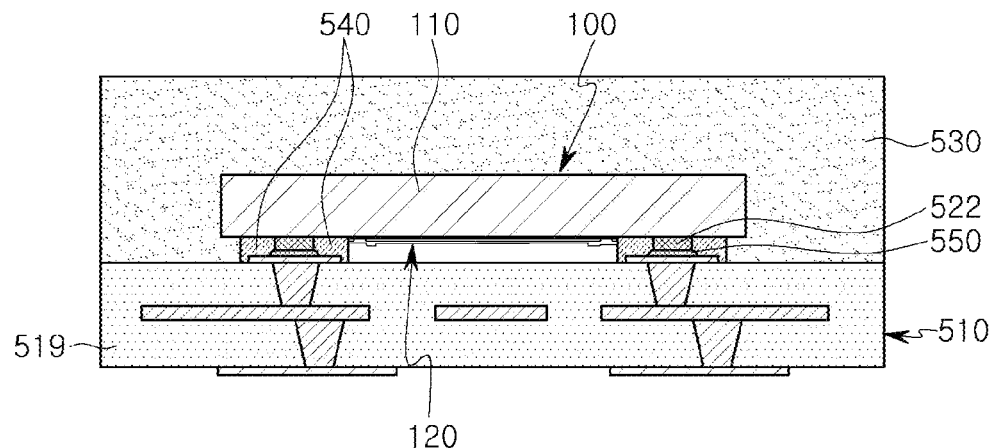

The bulk-acoustic resonator module illustrated in FIG. 25 may have connection terminals 522 disposed in the blocking member 540. Thus, the blocking member 540 may be disposed to surround the connection terminals 522, and an entirety of side surfaces of the connection terminals 522 may be bonded to the blocking member 540.

Figure 26:
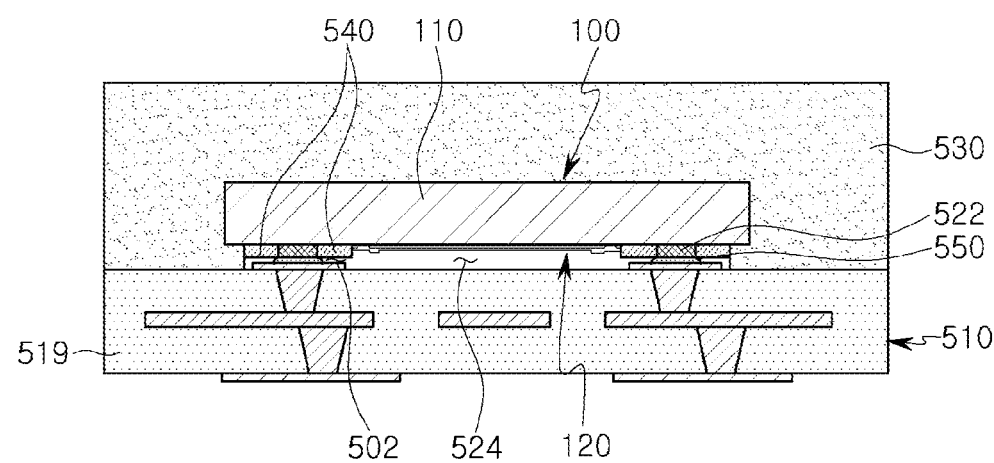

In the bulk-acoustic resonator module illustrated in FIG. 26, the blocking member 540 and the module substrate 510 may be spaced apart from each other by a predetermined distance. Therefore, a gap 502 may be formed between a lower surface of the blocking member 540 and an upper surface of the module substrate 510.

The distance by which the blocking member 540 and the module substrate 510 are spaced apart from each other may be limited to 30 μm or less. Thus, a molding resin may be blocked from flowing between the blocking member 540 and the module substrate 510

The lower surface of the blocking member 540 may be disposed on the same plane as the lower surface of the connection terminal 522. However, the disclosure is not limited to this configuration.

Figure 27:
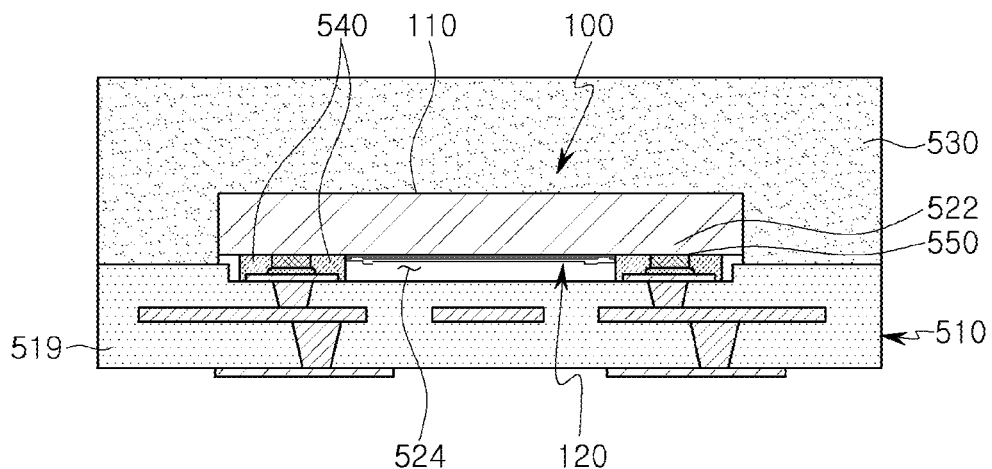

The bulk-acoustic resonator module illustrated in FIG. 27 may have the trench 524 formed on one surface of the module substrate 510, as illustrated in FIG. 20, and the blocking member 540 may be disposed in the trench 524 between the bulk-acoustic resonator 100 and the module substrate 510 in the trench 524. In FIG. 27, the blocking member 540 may be disposed to surround the connection terminal 522 similarly to the bulk-acoustic resonator module illustrated in FIG. 24. However, the disclosure is not limited to this configuration, and various modifications are be possible, such as configuring the blocking member 540 in a form illustrated in FIGS. 22 and 24.

Figure 28:
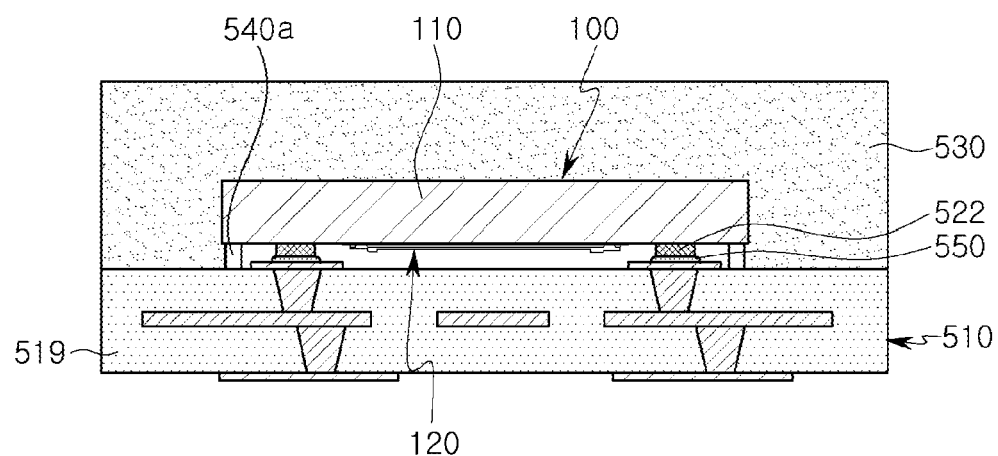

In the bulk-acoustic resonator module illustrated in FIG. 28, a blocking member 540a may be formed of a conductive material. Therefore, the blocking member 540a may be disposed between the lower surface of the bulk-acoustic resonator 100 and the module substrate 510, and may be spaced apart from the connection terminal 522.

The blocking member 540a may be formed together with the connection terminal 522 in the process of forming the connection terminal 522. Therefore, the blocking member 540a may be made of the same material as the connection terminal 522.

In addition, since the blocking member 540a is bonded to the conductive material of the bulk-acoustic resonator 100, the blocking member 540a may be firmly bonded to the bulk-acoustic resonator 100, unlike the blocking member 540 of FIG. 25, using the polymer. Therefore, even if the blocking member 540a is not bonded to the connection terminal 522, the blocking member 540a may be fixedly disposed at a desired position.

An example in which the blocking member 540a is disposed to surround the outside of the connection terminals 522 in FIG. 28. However, the disclosure is not limited to this configuration, and various modifications, for example, the blocking member 540a being disposed on the inner side (for example, between the resonating portion and the connection terminals 522) of the connection terminals 522, or a portion of the blocking member 540a being disposed outside the connection terminals 522 and a remaining portion of the blocking member 540a being disposed inside the connection terminals 522, or the like, may be made.

Figure 29:
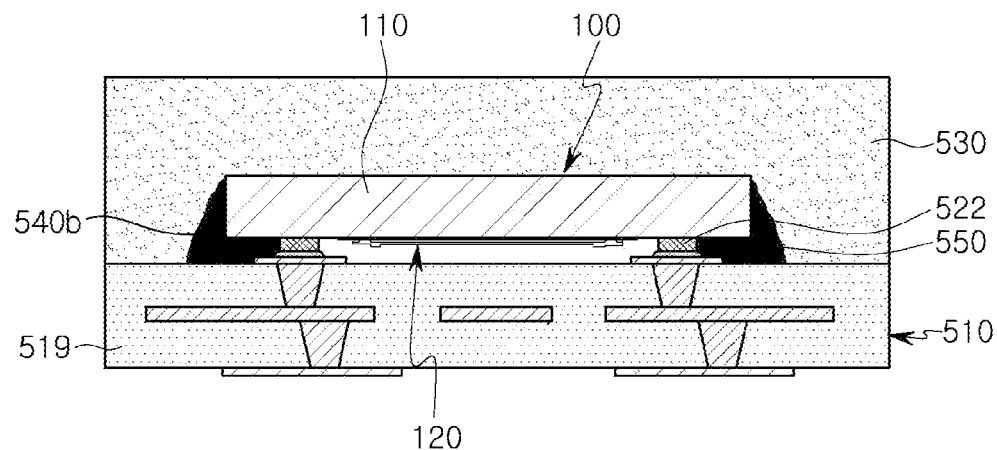

The bulk-acoustic resonator module illustrated in FIG. 29 may include a blocking member 540b disposed on the side surfaces of the bulk-acoustic resonator 100.

In the bulk-acoustic resonator module of the present embodiment, the bulk-acoustic resonator 100 is mounted on the module substrate 510, and then the blocking member 540b is formed along the rim of the bulk-acoustic resonator 100.

The blocking member 540b may be formed by injecting a liquid insulating material between the rim and the module substrate 510 through a needle and curing the insulating material. The liquid insulating material may be a polymer, but is not limited thereto.

By forming the blocking member 540b by using the above-described method, the blocking member 540b may be disposed not only between the lower surface of the bulk-acoustic resonator 100 and the module substrate 510, but also between the side surface of the resonator substrate 110 of the bulk-acoustic resonator 100 and the module substrate 510. In addition, although not shown, the blocking member 540b may be extended and disposed on the upper surface of the bulk-acoustic resonator 100 if necessary.

In FIG. 29, an example in which the blocking member 540b is in contact with the connection terminal 522 is illustrated. However, since the blocking member 540b is applied on the module substrate 510, the movement of the blocking member 540b may be suppressed. Therefore, it is also possible for the blocking member 540b to be spaced apart from the connection member 522.

Figure 30:
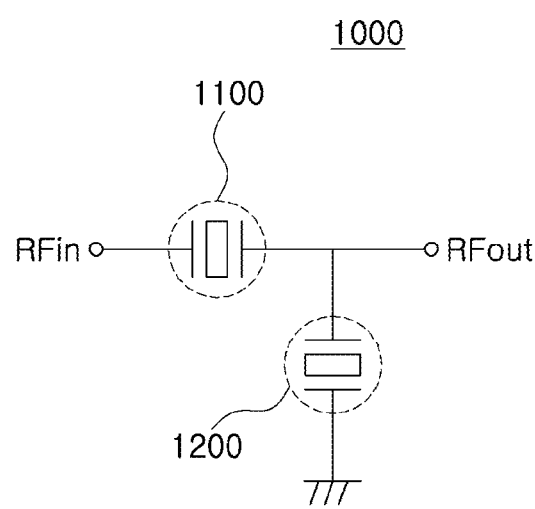
FIGS. 30 and 31 are schematic circuit views of filters, according to embodiments.
Figure 31:
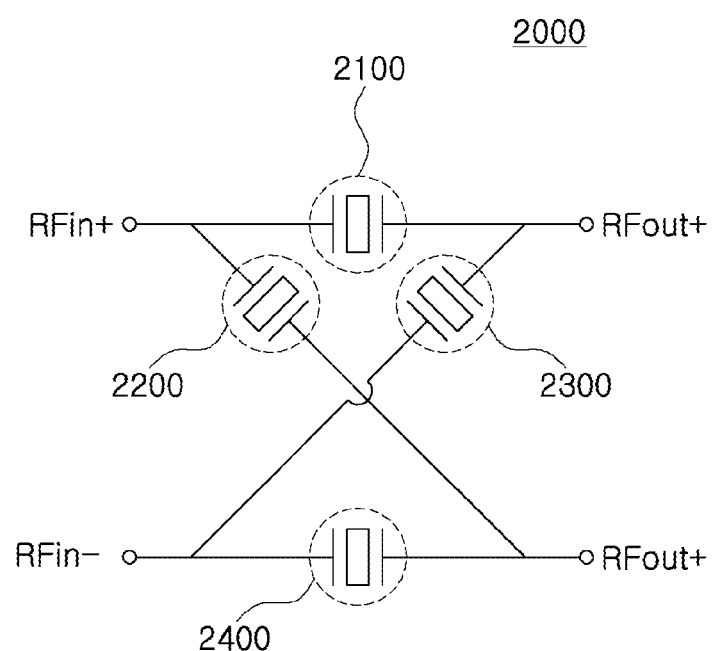

FIGS. 30 and 31 are schematic circuit diagrams of filters, according to embodiments, respectively.

Each of the bulk-acoustic resonators employed in the filters of FIGS. 30 and 31 correspond to the bulk-acoustic resonator 100 illustrated in FIG. 3.

Referring to FIG. 30, a filter 1000, according to an embodiment, may have a ladder type filter structure. Specifically, the filter 1000 may include bulk-acoustic resonators 1100 and 1200.

The first bulk-acoustic resonator 1100 may be connected in series between a signal input terminal to which the input signal RFin is input and a signal output terminal to which the output signal RFout is output, and the second bulk-acoustic resonator 1200 may be connected to the signal output terminal and a ground.

Referring to FIG. 31, a filter 2000, according to an embodiment, may have a lattice type filter structure. Specifically, the filter 2000 may include bulk-acoustic resonators 2100, 2200, 2300, and 2400, and may output RFout+ and RFout− output signals by filtering balanced input signals RFin+ and RFin−.

In addition, a filter may be formed to have a filter structure including a combination of the ladder type filter structure shown in FIG. 30 and the lattice type filter structure shown in FIG. 31.

As disclosed herein, a protective layer is formed by stacking a first protective layer and a second protective layer having different materials, and a hydrophobic layer is disposed on the second protective layer. Therefore, even when the acoustic resonator is used in a humid environment or is left at room temperature for an extended period of time of time, a frequency variation may be significantly reduced and uniform resonator performance may be maintained.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic resonator module, comprising:
   a module substrate;
   a bulk-acoustic resonator connected to the module substrate by a connection terminal and disposed spaced apart from the module substrate; and
   a sealing portion sealing the bulk-acoustic resonator,
   wherein the bulk-acoustic resonator comprises
      a resonator substrate;
      an insulating layer disposed on a surface of the resonator substrate;
      a resonating portion disposed opposite to an upper surface of the module substrate,
      a membrane layer forming a cavity together with the insulating layer, the resonating portion being disposed on the cavity, and comprising a first electrode, a piezoelectric layer, and a second electrode arranged in a stacked configuration,
      a protective layer disposed on the resonating portion, wherein the protective layer is disposed on the first electrode, the piezoelectric layer, and the second electrode in the resonating portion,
      a hydrophobic layer disposed on the protective layer, and
      a space is disposed between the resonating portion and the upper surface of the module substrate.

2. The bulk-acoustic resonator module of claim 1, wherein the bulk-acoustic resonator further comprises a resonator substrate,
   wherein the resonating portion comprises a first electrode, a piezoelectric layer, and a second electrode stacked on a cavity formed on the resonator substrate, and
   wherein the bulk-acoustic resonator module further comprises a blocking member disposed between the bulk-acoustic resonator and the module substrate, outside of the connection terminal, and at least partially covering a side surface of the resonator substrate.

3. The bulk-acoustic resonator module of claim 1, wherein the hydrophobic layer has a contact angle of 90° or more with water.

4. The bulk-acoustic resonator module of claim 1, wherein the hydrophobic layer comprises either one or both of fluorine (F) and silicon (Si).

5. The bulk-acoustic resonator module of claim 1, wherein the hydrophobic layer surrounds the cavity and the membrane layer.

6. The bulk-acoustic resonator module of claim 1, wherein the protective layer comprises a first protective layer formed of a silicon oxide-based or a silicon nitride-based insulating material, and a second protective layer formed of any one of an aluminum oxide-based insulating material, an aluminum nitride-based insulating material, a magnesium oxide-based insulating material, a titanium oxide-based insulating materials, a zirconium oxide-based insulating material, and a zinc oxide-based insulating material.

7. The bulk-acoustic resonator module of claim 1, wherein a distance between the bulk-acoustic resonator and the module substrate is 10 μm to 30 μm.

8. The bulk-acoustic resonator module of claim 1, wherein a trench is formed in the upper surface of the module substrate, and a portion of the connection terminal connecting the bulk-acoustic resonator to the module substrate is disposed in the trench.

9. The bulk-acoustic resonator module of claim 8, wherein a distance between the upper surface of the module substrate and a rim of a lower surface of the bulk-acoustic resonator is 0 μm to 20 μm.

10. The bulk-acoustic resonator module of claim 8, wherein a horizontal length of the trench is shorter than a horizontal length of the bulk-acoustic resonator.

11. The bulk-acoustic resonator module of claim 9, wherein a depth of the trench is 20 μm to 30 μm.

12. The bulk-acoustic resonator module of claim 1, further comprising a blocking member disposed between the bulk-acoustic resonator and the module substrate.

13. The bulk-acoustic resonator module of claim 12, wherein the blocking member is in contact with at least one surface of the connection terminal.

14. The bulk-acoustic resonator module of claim 12, wherein the blocking member is spaced apart from the upper surface of the module substrate.

15. The bulk-acoustic resonator module of claim 12, wherein a trench is formed in the upper surface of the module substrate, and the blocking member is disposed in the trench.

16. The bulk-acoustic resonator module of claim 12, wherein the blocking member is made of a conductive material, and is spaced apart from the connection terminal.

17. The bulk-acoustic resonator module of claim 1, further comprising a blocking member disposed outside of the connection terminal and formed to cover a side surface of the connection terminal.

18. The bulk-acoustic resonator module of claim 1, further comprising an electronic device mounted on the module substrate so as to be disposed adjacent to the bulk-acoustic resonator.

19. A bulk-acoustic resonator module, comprising:
   a module substrate;
   a bulk-acoustic resonator connected to the module substrate by a connection terminal and disposed spaced apart from the module substrate;
   a sealing portion sealing the bulk-acoustic resonator,
   wherein the bulk-acoustic resonator comprises a resonating portion disposed opposite to an upper surface of the module substrate, and a space is disposed between the resonating portion and the upper surface of the module substrate; and
   a blocking member disposed between the bulk-acoustic resonator and the module substrate.

20. A bulk-acoustic resonator module, comprising:
   a module substrate;
   a bulk-acoustic resonator connected to the module substrate by a connection terminal and disposed spaced apart from the module substrate;

a sealing portion sealing the bulk-acoustic resonator,
wherein the bulk-acoustic resonator comprises a resonating portion disposed opposite to an upper surface of the module substrate, and a space is disposed between the resonating portion and the upper surface of the module substrate; and
a blocking member disposed outside of the connection terminal and formed to cover a side surface of the connection terminal.

\* \* \* \* \*